(12) United States Patent
Lee et al.

(10) Patent No.: US 9,734,913 B2
(45) Date of Patent: Aug. 15, 2017

(54) DATA STORAGE DEVICE AND METHOD OF DRIVING THE SAME

(71) Applicants: SK hynix Inc., Icheon (KR); Seoul National University R&DB Foundation, Seoul (KR)

(72) Inventors: Jong Ho Lee, Seoul (KR); Ho Jung Kang, Seoul (KR); Nag Yong Choi, Jeonju (KR); Byeong Il Han, Icheon (KR); Kyoung Jin Park, Seoul (KR); Sung Yong Chung, Seongnam (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 15/063,060

(22) Filed: Mar. 7, 2016

(65) Prior Publication Data
US 2016/0260490 A1    Sep. 8, 2016

(30) Foreign Application Priority Data
Mar. 7, 2015   (KR) ...................... 10-2015-0032112

(51) Int. Cl.
| G11C 11/34 | (2006.01) |
| --- | --- |
| G11C 16/16 | (2006.01) |
| H01L 27/1157 | (2017.01) |
| H01L 27/11582 | (2017.01) |
| H01L 29/792 | (2006.01) |

(Continued)

(52) U.S. Cl.
CPC .......... *G11C 16/16* (2013.01); *G11C 16/0466* (2013.01); *G11C 16/0483* (2013.01); *G11C 16/3472* (2013.01); *H01L 27/1157* (2013.01); *H01L 27/11582* (2013.01); *H01L 29/792* (2013.01)

(58) Field of Classification Search
CPC . G11C 16/16; G11C 16/0466; G11C 16/0483; H01L 27/1157; H01L 27/11582; H01L 29/792
USPC ......................................... 365/185.29, 185.18
See application file for complete search history.

(56) References Cited

U.S. PATENT DOCUMENTS

| 6,897,533 B1* | 5/2005 | Yang ................. H01L 21/28282 257/316 |
| --- | --- | --- |
| 7,057,234 B2* | 6/2006 | Tiwari .............. H01L 21/28273 257/324 |

(Continued)

*Primary Examiner* — Viet Q Nguyen

(57) ABSTRACT

A data storage device includes a non-volatile memory device, which includes a memory cell array including a plurality of memory cells and a control circuit. Each of the memory cells includes a channel layer, a charge trap layer on the channel layer, and a control electrode on the charge trap layer, the charge trap layer being shared by the memory cells. The charge trap layer includes program regions respectively disposed below the control electrodes of the memory cells, and charge spread blocking regions, each of which is disposed between two adjacent ones of the program regions and between two adjacent ones of the control electrodes. The control circuit controls the memory cell array so that a potential barrier is generated in the charge spread blocking regions by charging the charge spread blocking regions with charges having the same polarity as that of program charges stored in the program regions.

23 Claims, 17 Drawing Sheets

(51) Int. Cl.
*G11C 16/04* (2006.01)
*G11C 16/34* (2006.01)

(56) References Cited

U.S. PATENT DOCUMENTS

| | | | |
|---|---|---|---|
| 7,071,061 B1* | 7/2006 | Pittikoun | H01L 21/28282 |
| | | | 257/E21.21 |
| 7,084,454 B2* | 8/2006 | Pinnow | H01L 21/28282 |
| | | | 257/324 |
| 7,713,875 B2* | 5/2010 | Brennan | H01L 21/28282 |
| | | | 257/413 |
| 8,203,884 B2 | 6/2012 | Kito et al. | |
| 8,315,093 B2 | 11/2012 | Dong et al. | |
| 8,553,467 B2 | 10/2013 | Shimura et al. | |
| 9,136,003 B1* | 9/2015 | Meir | G11C 16/10 |
| 9,502,521 B2* | 11/2016 | Ganguly | H01L 21/28282 |
| 2001/0053092 A1* | 12/2001 | Kosaka | G11C 16/10 |
| | | | 365/185.19 |
| 2009/0090961 A1* | 4/2009 | Ajika | H01L 29/792 |
| | | | 257/324 |
| 2009/0116294 A1* | 5/2009 | Tsai | G11C 16/10 |
| | | | 365/185.28 |
| 2010/0149880 A1* | 6/2010 | Chen | G11C 16/0475 |
| | | | 365/185.29 |
| 2015/0200016 A1* | 7/2015 | Rizel | G11C 16/26 |
| | | | 365/185.18 |
| 2016/0064088 A1* | 3/2016 | Shiga | G11C 16/14 |
| | | | 365/185.17 |

\* cited by examiner

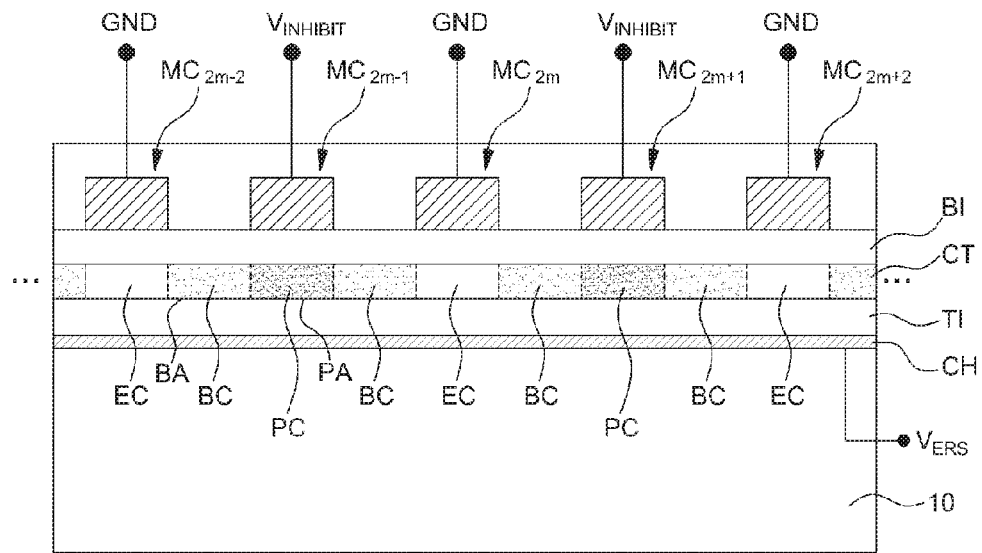
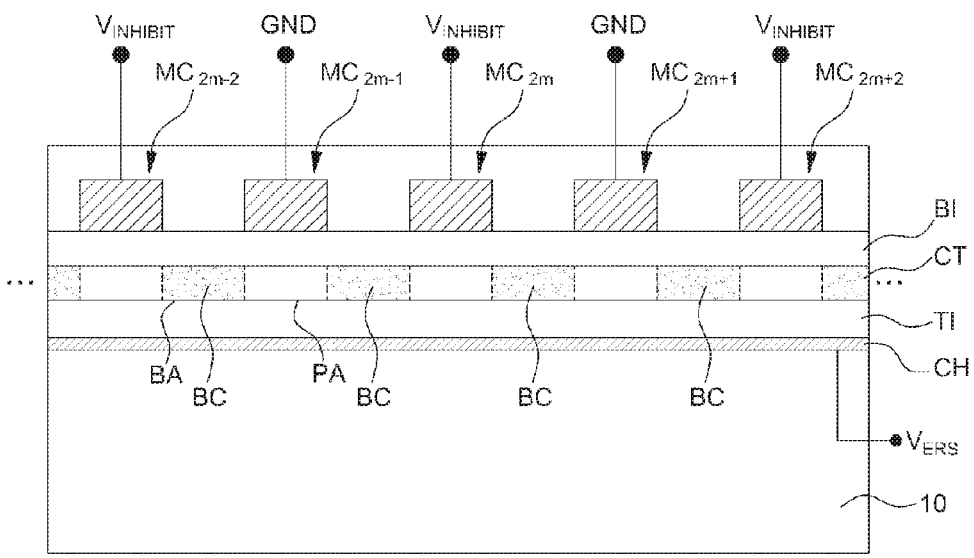

DATA STORAGE DEVICE AND METHOD OF DRIVING THE SAME

CROSS-REFERENCE TO RELATED APPLICATION

This application claims the benefit of Korean Patent Application No. 10-2015-0032112, filed on Mar. 7, 2015, entitled "Non-volatile memory device and method of driving the same," which is hereby incorporated by reference in its entirety into this application.

BACKGROUND

1. Technical Field

Embodiments of the present disclosure relate to semiconductor memory technology, and more particularly, to a data storage device including a non-volatile memory device and a method of driving the same.

2. Related Art

Recently, as demands for portable digital application devices, such as digital cameras, MP3 players, personal digital assistants (PDAs), smart phones, and the like, increase, the non-volatile memory device market is growing rapidly. Examples of non-volatile memory devices include a read-only memory (ROM), a programmable ROM (PROM), an erasable ROM (EROM), an electrically EPROM (EEPROM), and a flash memory device. From among the non-volatile memory devices, a flash memory device, e.g., a NAND flash memory device is one of the most popular non-volatile memory devices that enables miniaturization and high performance of digital application devices.

In a charge trap type flash memory device among flash memory devices, data is programmed or erased by providing or removing charges in or from a charge trap layer through tunneling or injecting of electrons into the charge trap layer in a memory cell. If charges stored in a programmed memory cell are gradually lost as time elapses, the programmed memory cell may be determined as an erased cell in which no data is stored when a threshold voltage of the programmed cell decreases to be less than a predetermined value. As a result, a data read failure may occur. Therefore, to secure reliability of the charge trap type flash memory device, it is required to achieve excellent data retention capability for maintaining data stored in the programmed cell without applying additional bias to the programmed memory cell.

Recently, as higher integration and larger capacity of non-volatile memory devices are strongly demanded, memory cells are continuously scaled down, and a demand for multi-level memory devices is also increasing. For such scaling down of memory cells and implementation of the multi-level memory device, it is necessary to reduce deterioration of data retention characteristics which is caused by change in a threshold voltage of a memory cell due to spreading of charges trapped in a charge trap layer of the memory cell toward memory cells adjacent to the memory cell. Furthermore, if trapped charges are thermally excited by rise of a temperature caused when a non-volatile memory device operates, the spreading of the trapped charges may be accelerated. Therefore, it is necessary to secure durability of the trapped charges against the thermal excitation.

SUMMARY

Embodiments of the present disclosure are directed to a non-volatile memory device having improved data retention characteristics and improved reliability, thereby providing high integration, high capacity, and multi-level programming.

Embodiments of the present disclosure are also directed to a method of driving the non-volatile memory device having the above-stated characteristics.

According to an aspect of the inventive concept, there is provided a non-volatile memory device includes a memory cell array including a plurality of memory cells; and a control circuit. Each of the plurality of memory cells may comprised a channel layer, a charge trap layer disposed over the channel layer, and a control electrode disposed over the charge trap layer, the charge trap layer being shared by the plurality of memory cells in the memory cell array. The charge trap layer may comprise program regions respectively disposed below the control electrodes of the plurality of memory cells; and charge spread blocking regions, each of which is disposed between two adjacent ones of the program regions and between two adjacent ones of the control electrodes. The control circuit may be configured to control the memory cell array so that a potential barrier is generated in the charge spread blocking regions by charging the charge spread blocking regions with charges having the same polarity as that of program charges stored in the program regions.

The memory cell array may comprise a plurality of memory strings, each memory string including the plurality of memory cells that are connected to one another in series. The channel layer is provided by a semiconductor pillar extending in a direction perpendicular to a main surface of a substrate, a first insulation layer, the charge trap layer, and a second insulation layer are sequentially disposed on sidewalls of the semiconductor pillar, and the memory cell array may be a 3-dimensional memory cell array.

The first insulation layer may be a tunneling insulation layer, and the second insulation layer may be a blocking insulation layer. The control circuit may perform a pre-programming operation for charging the program regions and the charge spread blocking regions of the charge trap layer with charges having a same polarity by applying a program voltage to the control electrodes of the plurality of memory cells simultaneously. The pre-programming operation may be performed by charging the charge spread blocking regions of the charge trap layer using a fringing electric field. The pre-programming operation may be performed for two or more pages, one or more strings, or one or more blocks in the memory cell array, or for the entire memory cell array.

The charge spread blocking regions may be charged by the injection of electric charge carriers from the channel layer, Fowler-Nordheim tunneling of electric charge carriers from a source or a drain of the channel layer, or Fowler-Nordheim tunneling of electric charge carriers from the channel layer. The control circuit may perform an erasing operation on the plurality of memory cells to preserve the potential barrier. To this end, a width of the charge spread blocking region may be greater than a width of the program region.

The control circuit performs a two-step erasing operation may comprise a first erasing step for erasing data of even-numbered memory cells from among the plurality of memory cells; and a second erasing step for erasing data of odd-numbered memory cells from among the plurality of memory cells, the second erasing step being performed separately in time from the first erasing step. According to an embodiment, if the two-step erasing operation is performed a number of times, an order of performing the first erasing step and the second erasing step may be changed each time the two-step erasing operation is performed.

Before the two-step erasing operation is performed, the control circuit may perform a pre-programming operation for charging the program regions and the charge spread blocking regions of the charge trap layer with charges having a same polarity by applying a program voltage to the control electrodes of the plurality of memory cells simultaneously. In this case, when the two-step erasing operation is performed a number of times, the pre-programming operation may be performed before each two-step erasing operation is performed. According to another embodiment, the non-volatile memory device may comprise a counter for counting a number of times that the two-step erasing operation is performed. The control circuit may receive information regarding the number of times that the two-step erasing operation is performed from the counter and, when the two-step erasing operation is repeated a specific number of times, performs the pre-programming operation before the specific number of times the two-step erasing operation is performed.

In case of programming one or more selected memory cells according to a program after erase (PAE) scheme, the pre-programming operation and the two-step erasing operation following the pre-programming operation are performed before a program operation is performed on the selected memory cells, and if data is erased from a predetermined area comprising some of the plurality of memory cells, one or more strings, one or more pages, or one or more blocks, the pre-programming operation and the two-step erasing operation are performed with respect to the predetermined area.

According to an aspect of the inventive concept, there is provided a method of driving a non-volatile memory device. The method may include a first erasing step for erasing data of even-numbered memory cells among a plurality of memory cells; and a second erasing step for erasing data of odd-numbered memory cells from among the plurality of memory cells, the second erasing step being performed separately in time from the first erasing step. The plurality of memory cells may share a charge trap layer. The charge trap layer comprises program regions respectively allocated to the plurality of memory cells and charge spread blocking regions, each of the charge spread blocking regions being disposed between two adjacent ones of the program regions.

According to an embodiment, the plurality of memory cells is included in a memory string. If the two-step erasing operation is performed a number of times, a sequence for performing the first erasing step and the second erasing step may be changed each time the two-step erasing operation is performed.

According to an embodiment, the method may further include performing a pre-programming operation on the plurality of memory cells before the two-step erasing operation, the pre-programming operation is performed to charge the charge spread blocking regions with charges having the same polarity as that of program charges stored in the program regions. According to an embodiment, in the pre-programming operation, the program regions and the charge spread blocking regions of the charge trap layer may be simultaneously charged with charges having a same polarity by applying a program voltage to control electrodes of the plurality of memory cells simultaneously. Furthermore, the pre-programming operation may be performed for at least two pages, one or more strings, or one or more blocks of a memory cell array including the plurality of memory cells, or for the entire memory cell array.

According to an embodiment, when the two-step erasing operation is performed a number of times, the pre-programming operation may be performed prior to each time the two-step erasing operation is performed. According to another embodiment, the pre-programming operation may be performed one time whenever the two-step erasing operation is repeated a specific number of times.

According to an aspect of the inventive concept, there is provided a method of driving a non-volatile memory device. The method may perform a pre-programming operation on a plurality of memory cells to charge spread blocking regions with charges having the same polarity as that of program charges stored in program regions. The plurality of memory cells may share a charge trap layer, and the charge trap layer comprises the program regions respectively allocated to the plurality of memory cells and the charge spread blocking regions, each of the charge spread blocking regions being disposed between two adjacent ones of the program regions. The pre-programming operation may be performed for at least two pages, one or more strings, or one or more blocks of a memory cell array including the plurality of memory cells, or for the entire memory cell array.

According to an embodiment two-step erasing operation may be performed after the pre-programming operation. The two-step erasing operation may comprise a first erasing step for erasing memory cells with one of even number turns or odd number turns from among the plurality of memory cells; and a second erasing step for erasing memory cells with the other of even number turns or odd number turns from among the plurality of memory cells.

When the two-step erasing operation is performed a number of times, the pre-programming operation may be performed prior to each time the two-step erasing operation is performed. According to another embodiment, the pre-programming operation may be performed one time whenever the two-step erasing operation is repeated a specific number of times. Furthermore, in case of programming one or more memory cells selected by using a program after erase (PAE) scheme, the pre-programming operation and the two-step erasing operation may be performed before a program operation is performed on the selected memory cells, and if data is erased from a predetermined area comprising some of the plurality of memory cells, one or more strings, one or more pages, or one or more blocks, the pre-programming operation and the two-step erasing operation may be performed with respect to the predetermined area.

BRIEF DESCRIPTION OF THE DRAWINGS

Hereinafter, embodiments of the present disclosure will be described in greater detail with reference to the accompanying drawings.

FIGS. 4A and 4B are cross-sectional view showing a method of driving a non-volatile memory device according to an embodiment of the present according to an embodiment of the present disclosure;

DETAILED DESCRIPTION OF THE INVENTIVE CONCEPT

Figure 1:
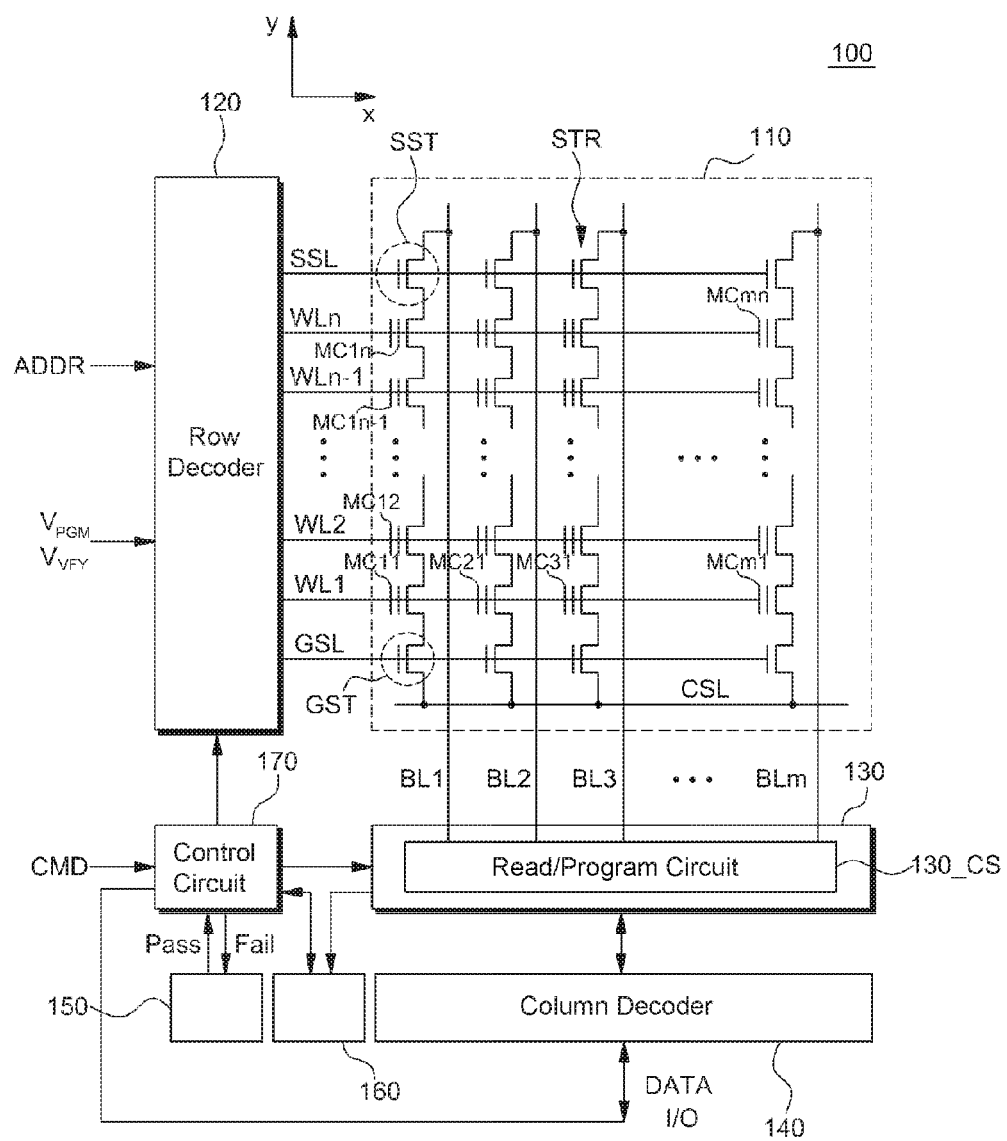
FIG. 1 is a block diagram of a non-volatile memory device according to an embodiment of the present disclosure.

Embodiments of the present invention will now be described more fully with reference to the accompanying drawings. The present invention may, however, be embodied in many different forms and should not be construed as being limited to the embodiments set forth herein; rather, these embodiments are provided so that this disclosure will be thorough and complete, and will fully convey the concept of the invention to those skilled in the art.

Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present.

Furthermore, a structure or a shape "adjacent to" another shape may overlap the adjacent shape or be arranged below the adjacent shape.

The relative terms including "below," "above," "upper," "lower," "horizontal," and "vertical" may be used to describe a relationship between an element, a layer, or a region and another element, another layer, or another region as shown in the drawings. It should be understood that the terms are not limited to the orientations shown in the drawings.

FIG. 1 is a block diagram of a non-volatile memory device 100 according to an embodiment of the present disclosure.

Referring to FIG. 1, the non-volatile memory device 100 may include a memory cell array 110, a row decoder 120, a read/program circuit 130, and a column decoder 140. The memory cell array 110 may be connected to the row decoder 120 via a plurality of word lines WL1, WL2, . . . , WLn−1, and WLn and selecting lines SSL and GSL, n being a positive integer. The memory cell array 110 may be connected to the read/program circuit 130 via a plurality of bit lines BL1, BL2, . . . , BLm, m being a positive integer.

If the non-volatile memory device 100 is a NAND flash memory device, the memory cell array 110 may include a plurality of memory strings STR, where each of the memory strings STR consists of a plurality of memory cells MCi1, MCi2, . . . , MCin−1, and MCin that are connected to one another in series, i being in a range of 1 to m. A plurality of memory cells MC11 to MCmn included in the memory cell array 110 are charge trap type non-volatile memory cells, each memory cell including a charge trap layer as a memory element. The charge trap layer may expand through a plurality of memory cells, e.g., MC11, MC12, . . . , MC1n−1, and MC1n within a single memory string, and may be shared by the plurality of memory cells MC11, MC12, . . . , MC1n−1, and MC1n. In another embodiment, the charge trap layer may be a single layer shared by memory strings adjacent to each other or shared by all memory strings within a memory block. The charge trap layer includes program regions respectively arranged below control electrodes of respective memory cells and charge spread blocking regions, each being disposed between two adjacent program regions. The memory cell array 110 may include a plurality of memory blocks, and each memory block may include a plurality of pages and a plurality of strings.

A string select transistor SST coupled to the selecting line SSL may be connected to one end of a memory string STR, whereas a ground select transistor GST coupled to the selecting line GSL may be connected to the other end of the memory string STR. The terms "string select transistor" and "ground select transistor" may be interchangeably used herein. Similarly, the terms "string select line" and "ground select line" may be interchangeably used herein. Therefore, the present invention should not be limited by the terms.

A common source line CSL may be connected to one ends of ground select transistors GST having the other ends respectively coupled to the other ends of the plurality of memory strings STR in the memory cell array 110. The word lines WL1, WL2, . . . , WLn−1, and WLn may be respectively connected to control electrodes, for example, control gates of the memory cells MCi1, MCi2, . . . , MCin−1, and MCin arranged in a column along a y-axis direction with respect to the orientation of FIG. 1. The bit lines BL1, BL2, . . . , BLm−1, and BLm may be respectively connected to one ends of string select transistors SST having the other ends respectively coupled to one ends of the plurality of memory strings STR in the memory cell array 110.

Memory cells MC1j, MC2j, . . . , and MCmj, which are arranged in a row along an x-axis direction with respect to the orientation of FIG. 1 and connected to a corresponding word line WLj, constitute a logic page, j being in a range of 1 to n. The number of pages per the word lines WL1, WL2, . . . , WLn-1, and WLn may be determined based on storage capacity of the memory cells. For example, according to a storage level of a memory cell, a single-level cell (SLC) memory that stores 1 bit of data per memory cell, a 4LC memory that stores 2 bits of data per memory cell, a 8LC memory that stores 3 bits of data per memory cell, and a 16LC memory that stores 4 bits of data per memory cell may be provided. A plurality of memory cells MC11 to MCmn may be 2-dimensionally arranged on a main surface of a semiconductor substrate for forming the memory cell array 110 or may be arranged to have a 3-dimensional structure including a vertical channel layer disposed perpendicular to the main surface of the semiconductor substrate.

The memory cells MC1j, MC2j, . . . , and MCmj constituting a page may be programmed in a same program cycle. For example, the memory cells MC11, MC21, . . . , and MCm1 connected to the word line WL1 may be programmed to a same program state (or a target value) or different program states in a same program cycle. In an embodiment, in a single program cycle, a first memory cell MC11 may be programmed to a first program state P1, a second memory cell MC21 may be programmed to a second program state P2, and the other memory cells MC31 and MCm1 may be programmed to a third program state P3. However, embodiments are not limited thereto. In an embodiment, in case of a single level cell (SLC) device having an interleaved architecture, even-numbered cells and odd-numbered cells may constitute two different pages, respectively. The even-numbered cells correspond to even-numbered bit lines, and the odd-numbered cells correspond to odd-numbered bit lines. Herein, the even-numbered cells may be interchangeably called as memory cells having even numbered turn, and the odd-numbered cells may be also interchangeably called as memory cells having odd numbered turn. Furthermore, in case of an MLC device in which each memory cell stores 2 or more bits of data, since each cell stores one least significant bit (LSB) and one most significant bit (MSB), the MLC device may have four pages constituted by even-numbered cells and odd-numbered cells. For example, in this case, the MLC device may provide an MSB page and an LSB page on the even-numbered cells and an MSB page and an LSB page on the odd-numbered cells.

The row decoder 120 may select any one of word lines of a selected memory block. The row decoder 120 may apply a word line voltage, for example, $V_{PGM}$ or $V_{VFY}$ provided by a voltage generator (not shown), to the selected word line of the selected memory block. For examples, during a programming operation, the row decoder 120 may apply the program voltage $V_{PGM}$ to the selected word line and apply a pass voltage $V_{PASS}$ to an unselected word line.

The memory cell array 110 may be addressed by the bit lines BL1, BL2, BL3, . . . , and BLm via the column decoder 140. The read/program circuit 130 may receive data transmitted from the outside or may transmit data read out of the memory cell array 110 to the outside, via the column decoder 140.

The read/program circuit 130 may include a page buffer 130_CS, and may operate as a detection amplifier or a program driver according to operation modes. Herein, a "read/program circuit" and a "page buffer" may be used as equivalent terms and shall be understood as inter-compatible terms. During a programming operation, the read/program circuit 130 receives data from an external device and transmits a bit line voltage corresponding to the data to a bit line of the memory cell array 110. During a read operation, the read/program circuit 130 may read out data stored in a selected memory cell via a selected bit line, latch the read out data, and output the latched data to the external device.

The read/program circuit 130 may perform a verification operation, which is in association with the programming operation, on a programmed memory cell in response to a transmission signal provided by a control circuit 170, and then, in response to the transmission signal, may output a result of the verification operation as a page buffer signal over a number of times. During the verification operation, the row decoder 120 may apply the verify voltage $V_{VFY}$ to the selected word line. In an embodiment, the read operation of the read/program circuit 130 may be performed based on charge integration using a bit line parasitic capacitor. The charge integration may be performed using a current sensing circuit in order to detect a program state of a selected memory cell.

A pass/fail verification circuit 150 verifies whether a selected memory cell has reached a desired level every time a program loop count increases. If the selected memory cell has a desired threshold voltage, that is, a target value, it is determined to be 'program pass,' and thus a programming operation and a verification operation for the selected memory cell are terminated. On the other hand, if the selected memory cell does not have the desired threshold voltage, it is determined to be 'program fail,' and thus the pass/fail verification circuit 150 may generate a predetermined signal, such as a count signal. That is, the pass/fail verification circuit 150 may determine whether the programming operation is successful or not, and then transmit a result of the determination to the control circuit 170.

The non-volatile memory device 100 may further include a counter 160. The counter 160 counts a number of times that an erasing operation is performed on a memory cell. In an embodiment, the control circuit 170 may perform a pre-programming operation before the erasing operation. In an embodiment, if the erasing operation is performed a number of times, the control circuit 170 may receive, from the counter 160, the number of times that the erasing operation is performed. When the erasing operation is performed a specific number of times, the control circuit 170 may perform the pre-programming operation. The erasing operation may be a conventional one-time erasing operation that is performed on memory cells (e.g., memory cells in a memory block) simultaneously or a two-step erasing operation according to an embodiment of the present disclosure. The two-step erasing operation will be described below.

In response to a command CMD, the control circuit 170 controls data transmission and a sequence of data writing (or programming)/erasing/reading operations. For the purpose, the control circuit 170 may control the row decoder 120, the read/program circuit 130, the column decoder 140, the pass/fail verification circuit 150, and the counter 160 to perform pulse programming and verification operations according to an incremental step pulse program (ISPP) algorithm. In at least one of the data writing/erasing/reading operations, the control circuit 170 may perform the pre-programming operation and/or the two-step erasing operation according to an embodiment of the present disclosure. In an embodiment, in case of programming a selected memory cell, a programming operation may be performed on the selected memory cell after the pre-programming operation and a subsequent two-step erasing operation are performed or after the two-step erasing operation is performed, according to a program after erase (PAE) algorithm. In another embodiment, if data of at least a portion of a memory cell array, e.g., one or more cells, at least one string, at least one page, or a specific area or block, is erased by using an erasing method known in the art, the pre-programming operation and the subsequent two-step erasing operation may be performed on the portion of the memory cell array from which the data is erased. In another embodiment, the control circuit 170 may perform the pre-programming operation and the subsequent two-step erasing operation on memory cell as an initialization operation like a format or reset operation.

The control circuit 170 may refer to information regarding a result of the programming operation, e.g., Pass/Fail information, transmitted from the pass/fail verification circuit 150 and determine whether to terminate or continue the programming operation. If a program fail result is received from the pass/fail verification circuit 150, the control circuit 170 controls the voltage generator (not shown), which generates the program voltage $V_{PGM}$ and the verify voltage $V_{VFY}$, and the read/program circuit 130 to perform a next program loop of the programming operation. As described above, to continue the programming operation according to an increasing number of program loops, the control circuit 170 may receive information regarding how many program loops have been performed. On the other hand, if the control circuit 170 receives a program pass result, the control circuit 170 terminates the programming operation for the selected memory cells.

The control circuit 170 may perform the two-step erasing operation and/or the pre-programming operation according to an embodiment of the present disclosure to improve data retention characteristics of a plurality of memory cells. The two-step erasing operation is an erasing technique designed to prevent trapped charges, which are trapped in charge spread blocking regions and form a potential barrier, from being de-trapped. The pre-programming operation is an operation for intentionally charging the charge spread blocking regions to have the same polarity as that of program charges stored in program regions. The pre-programming operation may be performed before the two-step erasing operation. Detailed descriptions thereof will be given with reference to FIGS. 4A to 5B.

In various designs, the control circuit 170 and the memory cell array 110 may be integrated in a single chip or may be arranged in different chips. For example, as in a solid state drive (SSD), the control circuit 170 may be provided at a flash translation layer (FTL), which is implemented in a chip separate from a chip in which the memory cell array 110 is provided.

Furthermore, although FIG. 1 shows that the pass/fail verification circuit 150 and the counter 160 described above are separate from the control circuit 170, embodiments are not limited thereto. In an embodiment, at least one of the pass/fail verification circuit 150 and the counter 160 may be integrated in the control circuit 170, or embodied as software or hardware in the control circuit 170.

Figure 2:
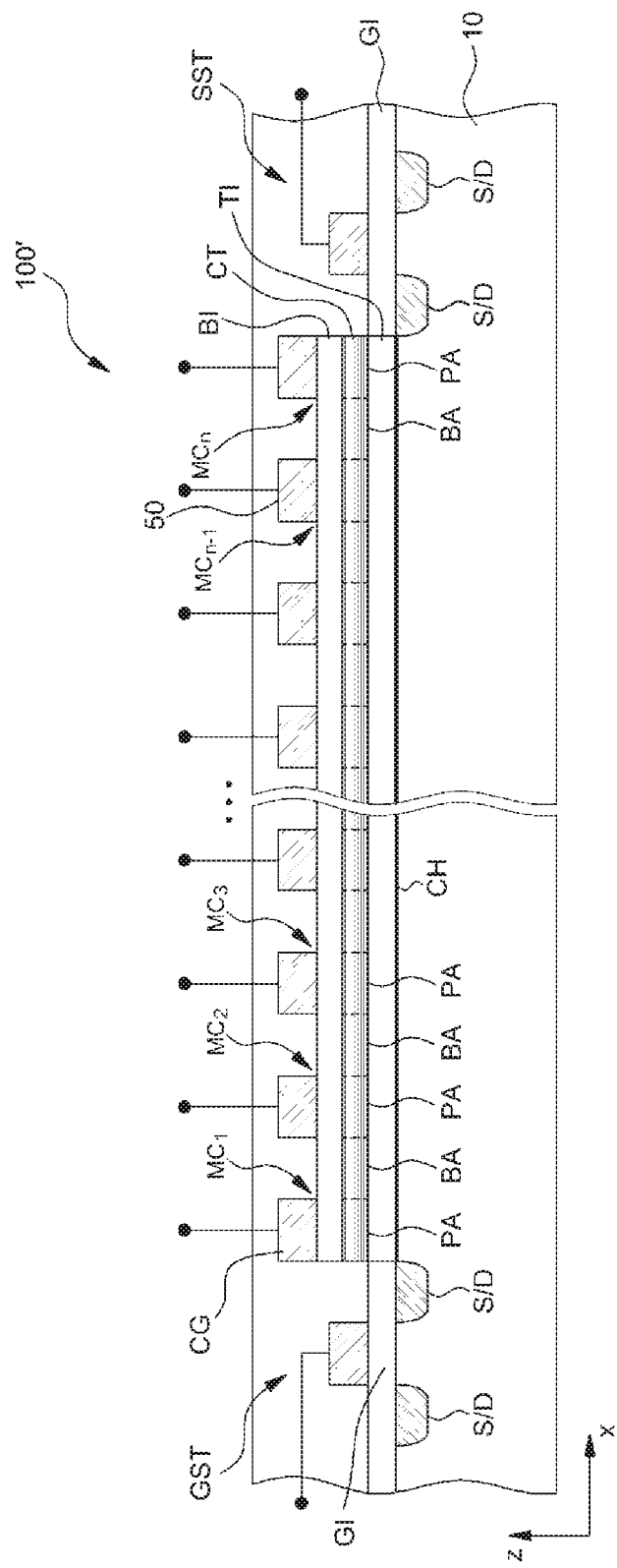
FIG. 2 is a cross-sectional view of a non-volatile memory device according to an embodiment of the present disclosure.

FIG. 2 is a cross-sectional view of a non-volatile memory device 100' according to an embodiment of the present disclosure.

Referring to FIG. 2, the non-volatile memory device 100' includes a plurality of memory cells $MC_1$, $MC_2$, $MC_3$, ..., $MC_{n-1}$, and $MC_n$ that are horizontally arranged on a substrate 10. If the non-volatile memory device 100' is a NAND flash memory device, the plurality of memory cells $MC_1$, $MC_2$, $MC_3$, ..., $MC_{n-1}$, and $MC_n$ may be aligned along a first direction as shown in FIG. 2, e.g., an x-axis direction parallel to the main surface of the substrate 10.

Each memory cell may include a channel layer CH extending in the x-axis direction, a charge trap layer CT disposed over the channel layer CH via a first insulation layer TI, and a control electrode (or control gate) CG disposed over the charge trap layer CT via a second insulation layer BI. The channel layer CH may be formed in a surface of an active region in the substrate 10.

Although it is not shown in FIG. 2, in an embodiment, impurity regions for forming source/drain regions of the plurality of memory cells $MC_1$, $MC_2$, $MC_3$, ..., $MC_{n-1}$, and $MC_n$ may be formed in portions of the channel layer CH between the respective control electrodes CG of the plurality of memory cells $MC_1$, $MC_2$, $MC_3$, ..., $MC_{n-1}$, and $MC_n$.

In another embodiment, as shown in FIG. 2, an impurity junction region may not be formed in the channel layer CH to provide a junction-free or junctionless NAND structure. In the junction-free NAND structure, a virtual source/drain region may be formed by a fringing field of the control electrode CG to drive the non-volatile memory device 100'. In still another embodiment, a turn-on current of the junction-free NAND structure may be further increased by forming a junctionless NAND structure having an N+ conductive type channel layer. In further still another embodiment, a P+ conductive type channel layer may be provided such that memory cell transistors operate in an enhanced mode.

The first insulation layer TI may include a dielectric material suitable for transmitting electrons or holes between the channel layer CH and the charge trap layer CT according to an injecting and extracting mechanism. The first insulation layer TI may contain a silicon oxide ($SiO_2$). In another embodiment, a different dielectric layer or stacked structure may be applied as the first insulation layer TI to prevent deterioration of the first insulation layer TI due to repeated cycles of reading/programming operations, e.g., increase of a density of charges trapped in the first insulation layer TI or insulation breakdown of the first insulation layer TI. Furthermore, a dielectric layer suitable for a band-engineered tunnel stack that is adjusted to improve an erasing speed while maintaining fine data retention characteristics may be selected to implement the first insulation layer TI. The adjusted band-engineered tunnel stack may be configured to improve the erasing speed by activating hole injection to the charge trap layer CT during an erasing operation, thereby preventing cycling deterioration. In an embodiment, the first insulation layer TI may not only extend to lower portions of a plurality of memory cells, but also extend to transistors GST and SST respectively coupled to ends of a memory string, such that the first insulation layer TI functions as gate insulation layers GI of the transistors GST and SST.

The charge trap layer CT may include a dielectric layer having a high free trap density. The charge trap layer CT may include a silicon nitride layer or another dielectric layer capable of trapping charges therein. The charge trap layer CT extends to adjacent memory cells and is shared by, e.g., the plurality of memory cells $MC_1$, $MC_2$, $MC_3$, ..., $MC_{n-1}$, and $MC_n$. In some embodiments, instead of being individualized to each memory cell, the charge trap layer CT may be formed with a single layer by a string, a page, a block, or a plane unit.

Referring to FIG. 2, the charge trap layer CT may include program regions PA and charge spread blocking regions BA. The program regions PA are respectively arranged below the control electrodes CG and respectively allocated to the plurality of memory cells $MC_1$, $MC_2$, $MC_3$, ..., $MC_{n-1}$, and $MC_n$. The charge spread blocking regions BA are respectively arranged between memory cells adjacent to each other or between program regions PA adjacent to each other. As shown in FIG. 2, the program regions PA and the charge spread blocking regions BA may be alternately arranged in the x-axis direction. Therefore, each of the program regions PA is adjacent to a corresponding one of the charge spread blocking regions BA.

The program regions PA are areas where data is programmed or erased as charges are injected thereto or discharged therefrom according to a quantum effect of charges, e.g., the Fowler-Nordheim tunneling mechanism, based on a direction of an electric field induced between a selected control electrode CG and the channel layer CH. Different data are recorded based on variation of threshold voltages $V_{th}$ of respective memory cells based on charges applied to the program regions PA.

The charge spread blocking regions BA are areas for preventing charges stored in the program regions PA from spreading toward adjacent memory cells along the charge trap layer CT, thereby preventing reduction of threshold voltages $V_{th}$ of programmed memory cells and thereby preventing read errors. To this end, the charge spread blocking regions BA may be charged to have the same polarity as that of charges stored in the program regions PA for storing data, thereby forming a potential barrier against the program charges stored in the program regions PA.

To charge the charge spread blocking regions BA to have the same polarity as that of the charges stored in the program regions PA, the control circuit 170 described above with reference to FIG. 1 may inject charges to the charge spread blocking regions BA and maintain the charges even during an erasing operation. Detailed descriptions thereof will be given below with reference to FIGS. 4A to 5B.

The second insulation layer BI may be a blocking insulation layer for preventing charges trapped in the charge trap layer CT from being drifted to the control electrode CG. The second insulation layer BI may contain a silicon oxide ($SiO_2$). However, embodiments are not limited thereto. To improve data retention and voltage coupling with the channel layer CH, the second insulation layer BI may contain a high-k material capable of increasing a film thickness as well as having a fine equivalent oxide film thickness (EOT). The high-k material may include aluminum oxide ($Al_2O_3$), yttrium oxide ($Y_2O_3$), silicon nitride ($Si_3N_4$), tantalum oxide ($Ta_2O_5$), lanthanum oxide ($La_2O_3$), hafnium oxide ($HfO_2$), or titanium oxide ($TiO_2$).

The control electrodes CG may be respectively combined with wirings for addressing, e.g., the word lines WL1, WL2, . . . , and WLn as shown in FIG. 1. The control electrode CG may be a poly-silicon electrode or a metal electrode. Various modifications may be applied to a stacked structure including the first insulation layer TI, the charge trap layer CT, the second insulation layer BI, and the control electrodes CG for storing data to improve performance of memory cells. In some embodiments, various stack options, such as silicon-oxide-nitride-oxide-silicon (SONOS), SANOS (SONOS using $Al_2O_3$ as a blocking layer), MANOS (SANOS alternative using a metal gate electrode), and BEMANOS (MANOS stack with a band engineered tunnel), may be used to implement the charge trapping memory cells. However, embodiments are not limited thereto. In an embodiment, a plurality of horizontal channels is stacked on a substrate to provide a non-volatile memory device having a 3-dimensional channel structure.

Figure 3A:
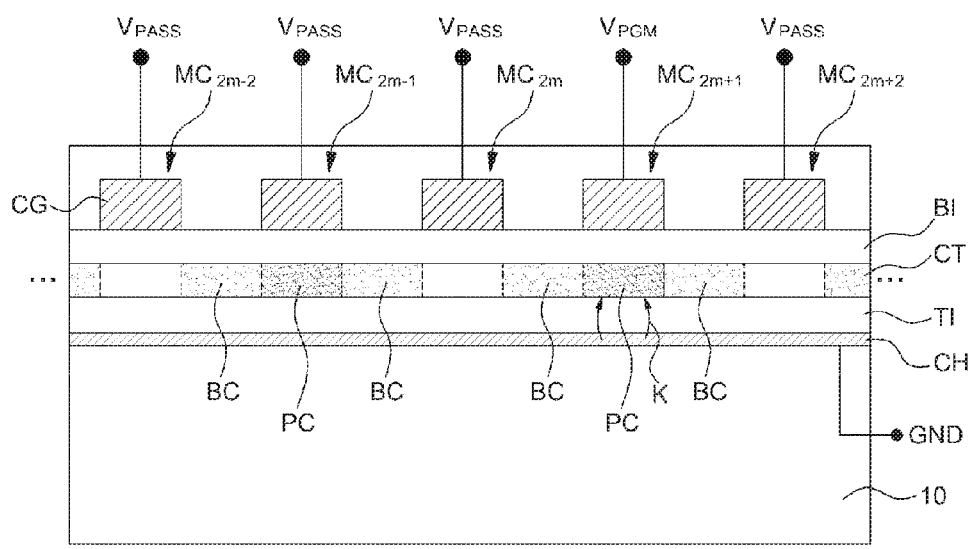
FIG. 3A is a cross-sectional view showing a program state of memory cells according to an embodiment of the present disclosure.
Figure 3B:
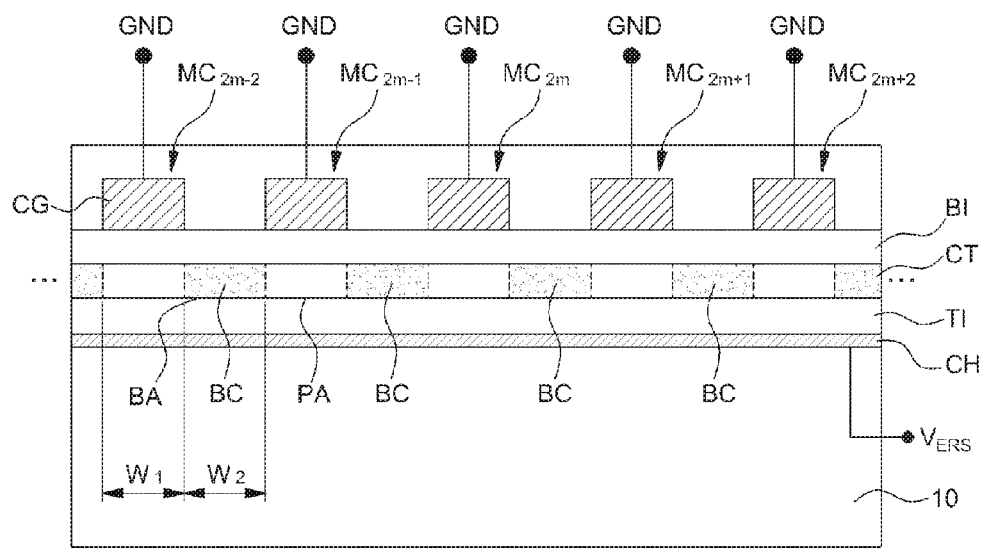
FIG. 3B is a cross-sectional view showing an erase state of memory cells according to an embodiment of the present disclosure.

FIG. 3A is a cross-sectional view showing a program state of memory cells according to an embodiment of the present disclosure, and FIG. 3B is a cross-sectional view showing an erase state of the memory cells.

Referring to FIG. 3A, a programming operation may be performed on a memory cell selected from memory cells according to an embodiment of the present disclosure. In FIG. 3A, memory cells $MC_{2m-1}$ and $MC_{2m+1}$ are sequentially selected from among a plurality of memory cells and programmed. FIG. 3A illustrates applying a program voltage $V_{PGM}$ to a control gate CG of the memory cell $MC_{2m+1}$ so as to program the memory cell $MC_{2m+1}$ after the memory cell $MC_{2m-1}$ has been programmed. The reference ID indicates an interlayer dielectrics.

In an embodiment, the programming operation regarding the memory cell $MC_{2m+1}$ may be performed by the control circuit 170 according to an incremental step pulse program (ISPP) algorithm. A memory cell is programmed with the ISPP program when a program voltage $V_{PGM}$ is applied thereto. The program voltage $V_{PGM}$ may be in the form of program pulses whose voltage levels are increased step-by-step when turns of a program loop for the memory cell $MC_{2m+1}$ are increased. The programming operation may be performed by differentiating electric field intensity between a selected memory cell and unselected memory cells, such as self-boosting or self-boosted program inhibit. However, the above-stated programming schemes are merely examples, and embodiments are not limited thereto.

In an embodiment, a program voltage $V_{PGM}$ from about 15V to about 20V may be applied to the selected memory cell $MC_{2m+1}$ for tunneling, whereas a pass voltage $V_{PASS}$ (e.g., from about 8V to about 10V) smaller than the program voltage $V_{PGM}$ may be applied to unselected memory cells $MC_{2m-2}$, $MC_{2m-1}$, $MC_{2m}$, and $MC_{2m+2}$ in FIG. 3A. Referring to FIG. 1 together with FIG. 3A to explain the programming operation of the selected memory cell $MC_{2m+1}$, a gate electrode of a string select transistor SST for selecting a string and a selected bit line, e.g., BL1, of the selected memory cell to be programmed may be grounded, whereas a $V_{DD}$ voltage may be applied to the unselected bit lines.

After that, a verification operation may be performed after application of the program pulses. The verification operation is performed by determining whether the programmed memory cell $MC_{2m+1}$ reached a threshold voltage, which is a target value. To this end, a verify voltage $V_{VFY}$ is applied to a word line, e.g., WL1, combined with the programmed memory cell $MC_{2m+1}$, thereby checking an ON/OFF state of the programmed memory cell $MC_{2m+1}$. During the verification operation, a page buffer (130 of FIG. 1) may detect ON/OFF states of selected memory cells by sensing voltage levels of bit lines coupled to the selected memory cells, and the detected data of the selected memory cells may be provided to the pass/fail verification circuit 150.

The verify voltage $V_{VFY}$ may be higher than a voltage used in a reading operation in order to achieve adequate gain margins and threshold voltage distributions in both a NOR memory cell and a NAND memory cell. In case of the NOR memory cell, during a verification operation, an operation for comparing a threshold voltage of the NOR memory cell with a threshold voltage of a reference memory cell may be performed.

If it is determined that the threshold voltage of the programmed memory cell $MC_{2m+1}$ reached the target voltage $V_{th}$, a program inhibition is set to the programmed memory cell $MC_{2m+1}$, and the programmed memory cell $MC_{2m+1}$ is excluded from subsequent program loops. If not, a program voltage $V_{PGM}$ having a voltage level increased by a specific value $\Delta V_{ISPP}$ than its previous value may be applied to the memory cell $MC_{2m+1}$, and a next program loop may be performed on the memory cell $MC_{2m+1}$. In this regard, the program voltage $V_{PGM}$ having a voltage level that is increased by the specific value $\Delta V_{ISPP}$ than its previous value in each program loop and the verify voltage $V_{VFY}$ having a constant voltage level will be provided to the memory cell $MC_{2m+1}$ through the selected word line WL1 until the threshold voltage of the programmed memory cell $MC_{2m+1}$ reaches the target voltage $V_{th}$.

Program charges PC, e.g., electrons, transferred from the channel layer CH as indicated by an arrow K are trapped in program regions PA of the programmed memory cells $MC_{2m-1}$ and $MC_{2m+1}$. On the other hand, in program regions PA of the other unselected memory cells $MC_{2m-2}$, $MC_{2m}$, and $MC_{2m+2}$ that are in an erase state, no program charges may be trapped or holes having an opposite polarity to that of the program charges PC may be trapped according to an erasing scheme.

In charge spread blocking regions BA adjacent to the program regions PA of the programmed memory cell $MC_{2m-1}$ and $MC_{2m+1}$, charges BC having the same polarity as the program charges PC, e.g., electrons, are trapped at trap sites of the charge spread blocking regions BA, and thus the charge spread blocking regions BA are charged to have the same polarity as that of the program charges PC. As a result, a potential barrier may be built in the charge spread blocking regions BA by the charges BC trapped in the charge spread blocking regions BA.

Generally, the charge trap layer CT may have a conduction mechanism corresponding to electric characteristics of a dielectric material constituting the charge trap layer CT. The conduction mechanism may be determined based on parameters including a trap level, a trap interval, a trap density, a carrier drift mobility, a dielectric relaxation time, and a state density of a conductive band. For example, in a dielectric material layer like the charge trap layer CT, electrons thermally excited to a conductive band of the charge trap layer CT may be de-trapped from the program regions PA of the programmed memory cell $MC_{2m-1}$ and $MC_{2m+1}$ by a conduction mechanism, such as Poole-Frenkel emission, hopping conduction due to tunneling of trapped electrons, or space-charge-limited conduction (SCLC), and the de-trapped electrons may spread toward the adjacent memory cells $MC_{2m-2}$, $MC_{2m}$, and $MC_{2m+2}$. As a result, the threshold voltages $V_{th}$ of the programmed memory cell $MC_{2m-1}$ and $MC_{2m+1}$ may be changed, and thus data loss or read error may occur.

However, according to an embodiment of the present disclosure, a potential barrier (or electric repulsion due to space charges) generated in a charge spread blocking region BA functions as a barrier for preserving program charges PC trapped in a program region PA by preventing the program charges PC in the program region PA from spreading toward adjacent memory cells. Therefore, data retention characteristics of the programmed memory cell $MC_{2m-1}$ and $MC_{2m+1}$ and reliability of a memory device based on the same may be improved.

FIG. 3B illustrates an erasing operation performed on memory cells according to an embodiment of the present disclosure. In the embodiment, the erasing operation may be performed by providing a ground voltage GND to a control electrode CG and applying a high voltage $V_{ERS}$ to a channel layer CH via a well of a substrate 10. In an embodiment, the erasing operation may reset data stored in memory cells by a block unit.

The erasing operation may be performed as charges stored in the program regions PA are de-trapped and transferred to the channel layer CH by tunneling. In an embodiment, during the erasing operation, the program charges stored in the program regions PA may be de-trapped and transferred to the channel layer CH. Simultaneously with the de-trapping and transferring of the program charges, or alternatively to the de-trapping and transferring of the program charges, charges having a polarity opposite to that of the program charges are injected to the program regions PA from the channel layer CH by tunneling. For example, in the erasing operation, electrons stored in the charge trap layer CT may be transferred to the channel layer CH, and, at the same time, holes may be injected from the channel layer CH to the charge trap layer CT. In this case, due to increased conductance, an erasing speed may be further improved, and damage of the first insulation layer TI that is a tunneling insulation layer may be reduced.

As shown in FIG. 3B, it is preferable to retain space charges BC for forming a potential barrier in the charge spread blocking regions BA even in an erase state. However, in case of performing an erasing operation on all memory cells $MC_{2m-2}$, $MC_{2m-1}$, $MC_{2m}$, $MC_{2m+1}$, and $MC_{2m+2}$ adjacent to one another at once or simultaneously as in the above-stated embodiment, the space charges BC in the charge spread blocking regions BA may be lost due to a fringing electric field that is induced between the control electrodes CG of the memory cells and the substrate 10. Moreover, during the erasing operation, as charges, e.g., holes, having a polarity opposite to that of the program charges PC are transferred to the charge spread blocking regions BA, the space charges BC in the charge spread blocking regions BA may be additionally lost. The loss of the space charges BC reduces height of a potential barrier capable of preventing the program charges PC in the program regions PA from spreading to the adjacent charge spread blocking regions BA, thereby deteriorating data retention characteristics.

Therefore, according to an embodiment of the present disclosure, a charge spread blocking region BA is formed to have a width W2 (corresponding to a distance between control electrodes) greater than a width W1 of a program region PA (corresponding to a width of a control electrode). As a result, when data of memory cells adjacent to one another are simultaneously removed during the erasing operation, it is possible to reduce effects from a fringing electric field and thus to prevent loss of charges BC of the charge spread blocking region BA. By preserving the charges BC of the charge spread blocking regions BA, the height of the potential barrier may be retained.

Figure 4C:
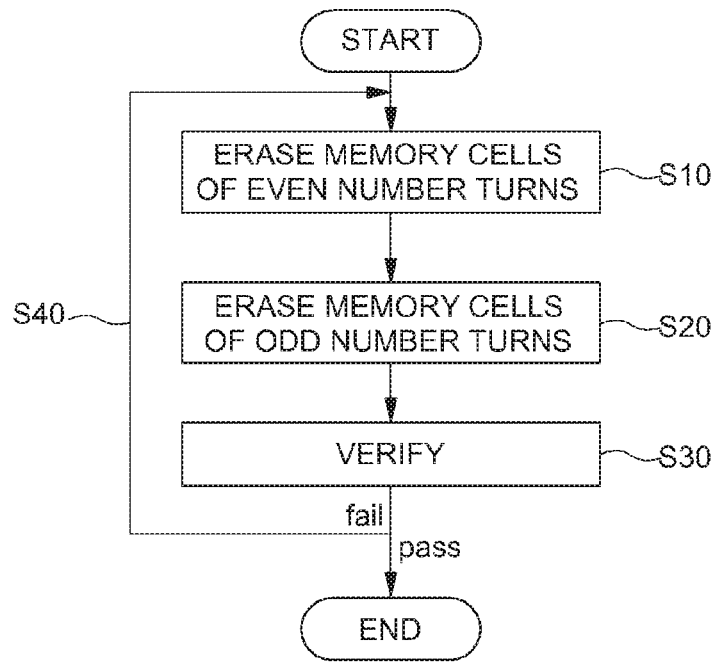
FIG. 4C is a flowchart showing the method of FIGS. 4A and 4B.
Figure 5A:
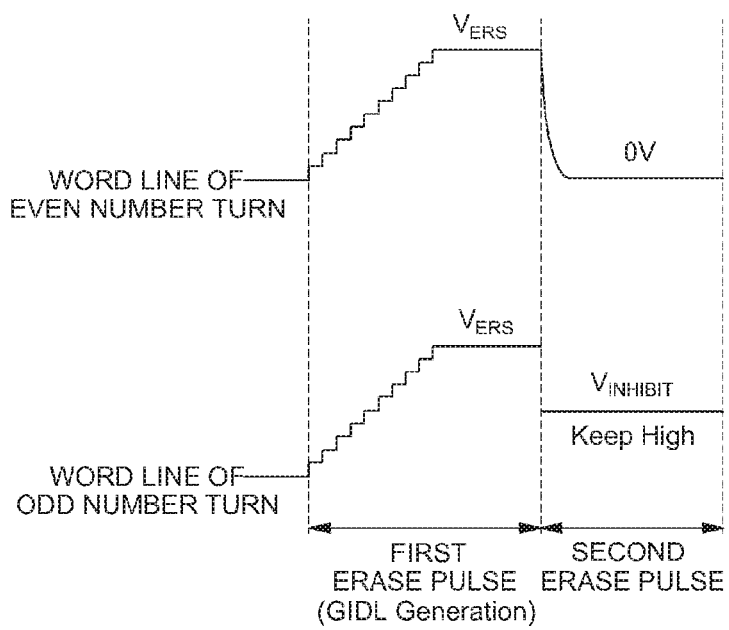
FIGS. 5A and 5B are views showing voltage signals in a first erasing step and a second erasing step, respectively.
Figure 5B:
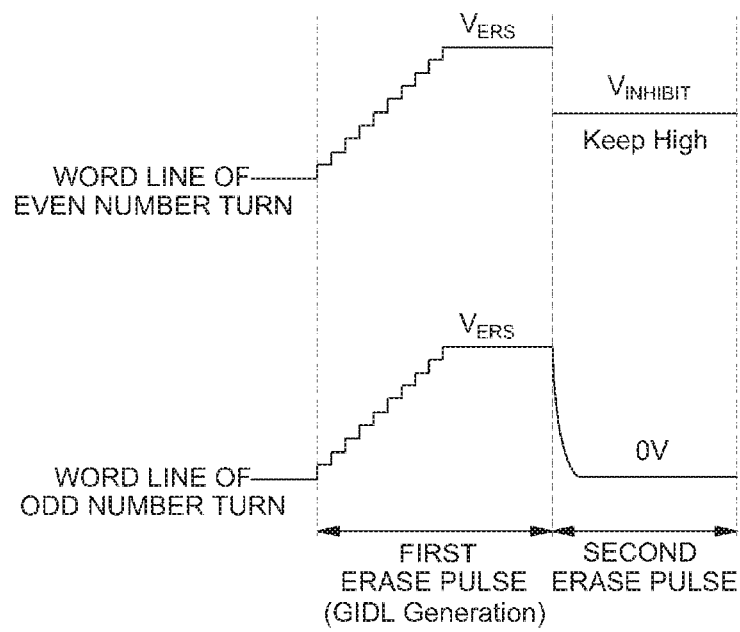

FIGS. 4A and 4B are cross-sectional views showing a method of driving a non-volatile memory device according to another embodiment of the present disclosure, and FIG. 4C is a flowchart showing the method. FIGS. 5A and 5B are views showing voltage signals in a first erasing step and a second erasing step, respectively.

In a two-step erasing operation according to an embodiment of the present disclosure, charges BC injected to charge spread blocking regions BA of a charge trap layer CT are retained, and program charges PC are selectively removed from program regions PA, thereby resetting a plurality of memory cells, e.g., $MC_{2m-2}$, $MC_{2m-1}$, $MC_{2m}$, $MC_{2m+1}$, and $MC_{2m+2}$ in FIGS. 4A and 4B. To this end, the two-step erasing operation includes a first erasing step and a second erasing step, where the first erasing step and the second erasing step are alternately performed. For example, the first erasing step erases data of even-numbered memory cells (e.g., memory cells respectively coupled to word lines of even-numbered turns), and the second erasing step erases data of odd-numbered cells (e.g., memory cells respectively coupled to word lines of odd-numbered turns), from among a plurality of memory cells sharing the charge trap layer CT. The two-step erasing operation may be performed by the control circuit 170 shown in FIG. 1. The plurality of memory cells may be memory cells belonging to one memory string or to at least a unit block (a unit block or an entire memory cell array).

Referring to FIGS. 4A and 4C, in the first erasing step S10, an erasing operation may be performed on the even-numbered memory cells, e.g., $MC_{2m-2}$, $MC_{2m}$, $MC_{2m+2}$, and so on, from among the plurality of memory cells $MC_{2m-2}$, $MC_{2m-1}$, $MC_{2m}$, $MC_{2m+1}$, $MC_{2m-2}$, and so on. The control circuit 170 may provide a ground voltage GND to word lines respectively coupled to control electrodes CG of the even-numbered memory cells $MC_{2m-2}$, $MC_{2m}$, $MC_{2m+2}$, and so on. The control circuit 170 may apply an inhibit voltage $V_{INHIBIT}$ to word lines respectively coupled to control electrodes CG of the odd-numbered memory cells $MC_{2m-1}$, $MC_{2m+1}$, and so on or electrically float the word lines of the odd-numbered memory cells $MC_{2m-1}$, $MC_{2m+1}$, and so on. An erase voltage $V_{ERS}$ may be applied to the channel layer CH via a well of the substrate 10. The inhibit voltage $V_{INHIBIT}$ may be greater than 0V and smaller than the erase voltage $V_{ERS}$.

In the first erasing step S10, program charges PC of the program regions PA of the even-numbered memory cells $MC_{2m-2}$, $MC_{2m}$, $MC_{2m+2}$, and so on are transferred to the channel layer CH, and thus data of the even-numbered memory cells $MC_{2m-2}$, $MC_{2m}$, $MC_{2m+2}$, and so on are erased such that the program regions PA of the even-numbered memory cells $MC_{2m-2}$, $MC_{2m}$, $MC_{2m+2}$, and so on are in a no-charge state EC. On the other hand, since potentials of the word lines of the odd-numbered memory cells $MC_{2m-1}$, $MC_{2m+1}$, and so on are increased by the inhibit voltage $V_{INHIBIT}$, charges PC in the program regions PA of the odd-numbered memory cells $MC_{2m-1}$, $MC_{2m+1}$, and so on are not transferred to the channel layer CH. Furthermore, if the inhibit voltage $V_{INHIBIT}$ is applied to the odd-numbered memory cells $MC_{2m-1}$, $MC_{2m+1}$, and so on or the memory cells $MC_{2m-1}$, $MC_{2m+1}$, and so on are in a floating state, no strong electric field is induced between the control electrodes CG of the memory cells $MC_{2m-1}$, $MC_{2m+1}$, and so on and the substrate 10, and thus the intensity of a fringing electric field is reduced such that charges BC trapped in the charge spread blocking regions BA may be stably preserved.

In an embodiment, referring to FIG. 5A, in the first erasing step S10, the control circuit 170 may accumulate holes in the channel layer CH using the gate-induce drain leakage (GIDL) phenomenon by applying a first erase pulse having a voltage level, which sequentially increases to the erase voltage $V_{ERS}$ to be applied to the channel layer CH, to word lines of all of the memory cells $MC_{2m-2}$, $MC_{2m-1}$, $MC_{2m}$, $MC_{2m+1}$, $MC_{2m+2}$, and so on. Next, the control circuit 170 may ground the word lines of the even-numbered memory cells $MC_{2m-2}$, $MC_{2m}$, $MC_{2m+2}$, and so on and apply a second erase pulse that applies the inhibit voltage $V_{INHIBIT}$ to the odd-numbered memory cells $MC_{2m-1}$, $MC_{2m+1}$, thereby performing an erasing operation only on the even-numbered memory cells $MC_{2m-2}$, $MC_{2m}$, $MC_{2m+2}$, and so on.

Referring back to FIGS. 4B and 4C, after the first erasing step S10, the control circuit 170 may ground the word lines of the odd-numbered turns combined with the control electrodes CG of the memory cells $MC_{2m-1}$, $MC_{2m+1}$, and so on, and apply the inhibit voltage $V_{INHIBIT}$ to the even-numbered memory cells $MC_{2m-2}$, $MC_{2m}$, $MC_{2m+2}$, and so on or electrically float the even-numbered memory cells $MC_{2m-2}$, $MC_{2m}$, $MC_{2m+2}$, and so on, in the second erasing step S20. The erase voltage $V_{ERS}$ may be applied to the channel layer CH, for example, via the well of the substrate 10. As a result, program charges PC of the program regions PA of the odd-numbered memory cells $MC_{2m-1}$, $MC_{2m+1}$, and so on are transferred to the channel layer CH, and thus data of the odd-numbered memory cells $MC_{2m-1}$, $MC_{2m+1}$, and so on are erased. In addition, potentials of the word lines of the even-numbered turns are increased by the inhibit voltage $V_{INHIBIT}$, thus charges of the program regions PA of the even-numbered memory cells $MC_{2m-2}$, $MC_{2m}$, $MC_{2m+2}$, and so on are not transferred to the channel layer CH. Furthermore, if the inhibit voltage $V_{INHIBIT}$ is applied to the even-numbered memory cells $MC_{2m-2}$, $MC_{2m}$, $MC_{2m+2}$, and so on or the even-numbered memory cells . . . , $MC_{2m-2}$, $MC_{2m}$, $MC_{2m+2}$, and so on are in a floating state, no string electric field is induced between the control electrodes CG of the even-numbered memory cells . . . , $MC_{2m-2}$, $MC_{2m}$, $MC_{2m+2}$, and so on and the substrate 10, and thus the intensity of a fringing electric field is reduced such that the charges trapped in the charge spread blocking regions BA may be stably preserved.

In an embodiment, referring to FIG. 5B, in the second erasing step S20, the control circuit 170 accumulates holes in the channel layer CH using the GIDL phenomenon by applying a first erase pulse having a voltage level, which sequentially increases to the erase voltage $V_{ERS}$ to be applied to the channel layer CH, to the word lines of all of the memory cells $MC_{2m-2}$, $MC_{2m+1}$, $MC_{2m}$, $MC_{2m+1}$, $MC_{2m+2}$, and so on. Next, the control circuit 170 may ground the word lines of the odd-numbered memory cells $MC_{2m-1}$, $MC_{2m+1}$, and so on and apply a second erase pulse that applies the inhibit voltage $V_{INHIBIT}$ to the even-numbered memory cells $MC_{2m-2}$, $MC_{2m}$, $MC_{2m+2}$, and so on, thereby performing an erasing operation on the odd-numbered memory cells $MC_{2m-1}$, $MC_{2m+1}$, and so on.

The two-step erasing operation shown in FIGS. 5A and 5B is a programming scheme using the GIDL phenomenon. However, embodiments are not limited thereto. In another embodiment, the operation using the first erase pulse may be omitted, or an erasing mechanism using a phenomenon such as random telegraph noise (RTN) may be used. Furthermore, voltages applied to bit lines and select lines may vary depending on whether a memory cell array includes a well or not.

It should be understood that a two-step erasing operation according to another embodiment of the present disclosure may be performed in an order opposite to the order shown in FIGS. 4A and 4B. In an embodiment, an erasing operation may be performed on the odd-numbered memory cells $MC_{2m-1}$, $MC_{2m+1}$, and so on in the first erasing step S10, and then an erasing operation may be performed on the even-numbered memory cells $MC_{2m-2}$, $MC_{2m}$, $MC_{2m+2}$, and so on in the second erasing step S20. In another embodiment, the two-step erasing operation may be performed a number of times based on a command of a user. In this embodiment, the first erasing step S10 and the second erasing step S20 constituting of each two-step erasing operation may be performed in reversed order. For example, in a first erasing operation, the first erasing steps S10 may be performed on odd-numbered memory cells, and then second erasing steps S20 may be performed on even-numbered memory cells, and then, in a subsequent erasing operation following the first erasing operation, the first erasing steps S10 may be performed on the even-numbered memory cells, and then the second erasing steps S20 may be performed on the odd-numbered memory cells.

In an embodiment, as shown in FIG. 4C, after the first erasing step S10 and the second erasing step S20 are performed, the control circuit 170 may perform a verification operation S30 for determining whether the erasing operation is failed or passed. If the two-step erasing operation performed on the memory cells is determined to be failed, the first erasing step S10 and the second erasing step S20 may be repeated. If the two-step erasing operation performed on the memory cells is determined to be passed, the erasing operation is terminated. In the above-stated embodiments, each of the first erasing step S10 and the second erasing step S20 may be independently performed one or more times. However, embodiments are not limited thereto.

As described above, since the two-step erasing operation including the operation for erasing data of the odd-numbered memory cells $MC_{2m-1}$, $MC_{2m+1}$, and so on and the operation for erasing data of the even-numbered memory cells $MC_{2m-2}$, $MC_{2m}$, $MC_{2m+2}$, and so on is performed on two or more memory cells adjacent to each other in a string of memory cells, a page of memory cells, or a block of memory cells, space charges BC forming a potential barrier in a charge spread blocking region BA of a charge trap layer CT may be preserved. After the erasing operation is completed, in case of performing a programming operation on a selected memory cell as described above with reference to FIG. 3A, the spreading of program charges PC trapped in a program region PA toward adjacent memory cells is substantially prevented by a potential barrier formed in a charge spread blocking region BA adjacent to the program region PA, and thus data retention characteristics of the selected memory cell may be improved.

The two-step erasing operation may be performed in combination with a program after erase (PAE) scheme before a programming operation is performed on a selected memory cell. Furthermore, the two-step erasing operation may be performed on a portion of a memory cell array including at least two word lines (e.g., 2 or more pages), one or more strings, or one or more blocks, or the entire memory cell array.

Figure 6A:
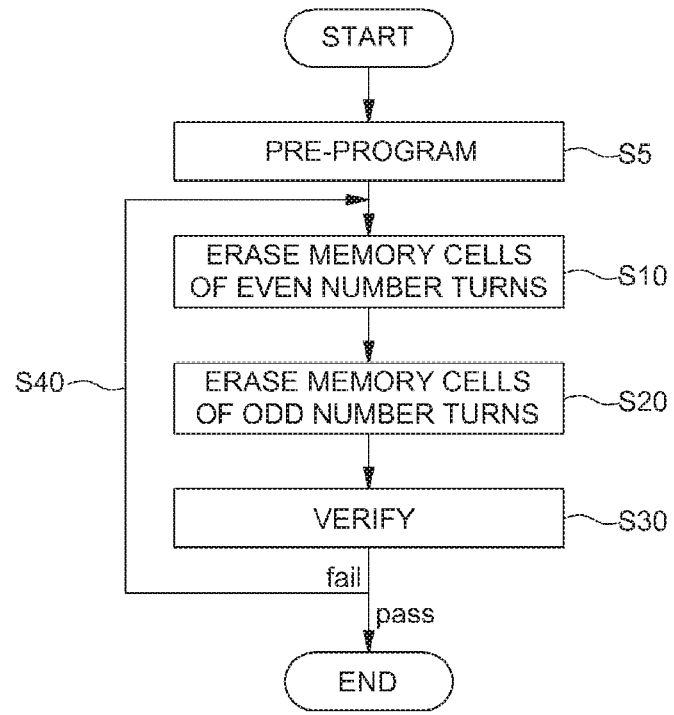
FIG. 6A is a flowchart showing a method of driving a non-volatile memory according to another embodiment.
Figure 6B:
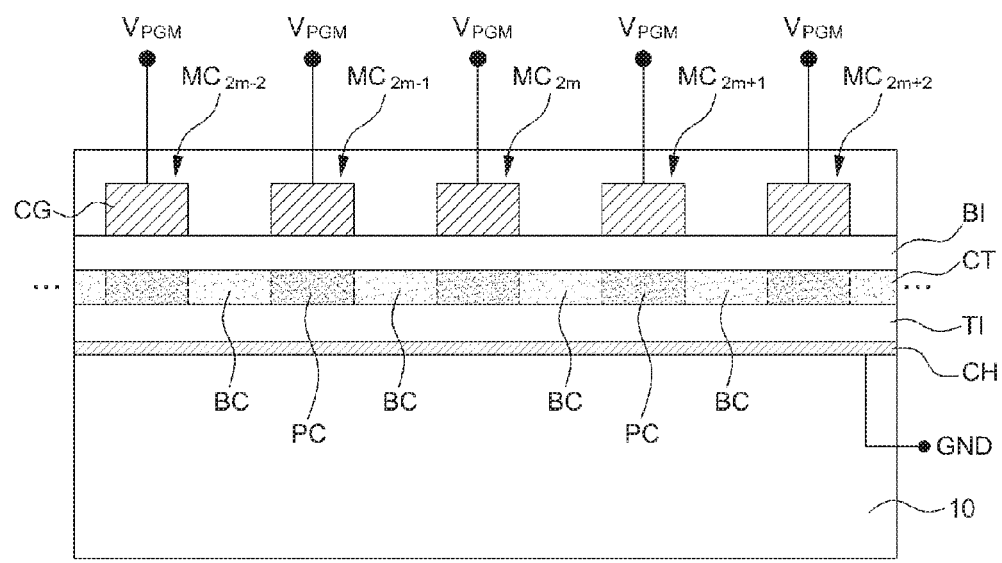
FIG. 6B is a cross-sectional view showing a pre-programming operation.

FIG. 6A is a flowchart showing a method of driving a non-volatile memory according to another embodiment, and FIG. 6B is a cross-sectional view showing a pre-programming operation.

Referring to FIGS. 6A and 6B, the driving method may further include a pre-programming operation S5 before the two-step erasing operation including the first erasing step S10 and the second erasing step S20 shown in FIG. 4C. The pre-programming operation S5 is an operation for intentionally injecting charges for forming a potential barrier to charge spread blocking regions BA of a charge trap layer CT before the two-step erasing operation. The charge spread blocking regions BA may be charged by the injection of electric charge carriers, for example, electrons from a channel layer CH, Fowler-Nordheim tunneling of the electric charge carrier from a source or a drain of the channel layer CH, and/or Fowler-Nordheim tunneling of the electric charge carrier from the channel layer CH.

In an embodiment, the pre-programming operation and the two-step erasing operation may be combined with a program after erase (PAE) scheme. In this case, a combination of the pre-programming operation and the two-step erasing operation may be performed before a selected memory cell is programmed. The pre-programming operation and the two-step erasing operation may be performed on at least two word lines (e.g., 2 or more pages), one or more strings, or one or more blocks, or the entire memory cell array of a memory cell array. Embodiments are not limited to the PAE scheme.

According to another embodiment, if data of a portion of a memory cell array, e.g., one or more cells, at least one string, at least one page, or a specific area or block, are erased by using an erasing method known in the art, the pre-programming operation and the two-step erasing operation according to an embodiment of the present disclosure may be performed on the corresponding erased portion in order to improve data retention characteristics. According to an embodiment, the pre-programming operation and the two-step erasing operation may be used as an initialization operation such as an operation for formatting or resetting memory cells of a non-volatile memory device.

The control circuit 170 may perform the pre-programming operation S5 on a plurality of memory cells $MC_{2m-2}$, $MC_{2m-1}$, $MC_{2m}$, $MC_{2m+1}$, $MC_{2m+2}$, and so on simultaneously. The pre-programming operation S5 may be performed on a portion of a memory cell array including at least two word lines (e.g., 2 or more pages), one or more strings, or one or more blocks, or the entire memory cell array. Preferably, the pre-programming operation S5 may be performed by a block unit.

According to an embodiment, in the pre-programming operation S5, as shown in FIG. 6B, a program voltage $V_{PGM}$ may be simultaneously applied to at least two word lines that are adjacent to each other and combined with the control electrodes CG of the plurality of memory cells $MC_{2m-2}$, $MC_{2m+1}$, $MC_{2m}$, $MC_{2m+1}$, $MC_{2m+2}$, and so on, whereas gate electrodes of select transistors and bit lines corresponding to the pre-programming operation S5 may be grounded. Therefore, the program regions PA and the charge spread blocking regions BA of the charge trap layer CT shared by the plurality of memory cells $MC_{2m-2}$, $MC_{2m+1}$, $MC_{2m}$, $MC_{2m+1}$, $MC_{2m+2}$, and so on are simultaneously charged by charges having the same polarity as that of program charges. According to an embodiment, the pre-programming operation S5 may be performed according to the incremental step pulse program (ISPP) algorithm.

After the pre-programming operation S5 is performed, the control circuit 170 may perform an erasing operation on a plurality of memory cells so as to preserve potential barriers formed in the charge spread blocking regions BA. For example, as shown in FIG. 6A, the first erasing step S10 and the second erasing step S20 may be sequentially performed as described above with reference to FIGS. 4A to 4C.

After the erasing operation S10 and S20 are performed, the verification operation S30 may be performed. The verification operation S30 may be an operation for determining whether all memory cells are in an erase state. In the verification operation S30, ON/OFF states of memory cells are checked by applying a verify voltage $V_{VFY}$ to word lines of the memory cells. As a result of the verification operation S30, if the erasing operation for the memory cells is determined to be failed, the first erasing step S10 and the second erasing step S20 may be repeated. On the other hand, if the erasing operation for the memory cells is determined to be succeeded or passed, the erasing operation is terminated.

In the above-stated embodiments, the pre-programming operation may be always performed in association with the two-step erasing operation or may be intermittently performed in order to preserve a desired quantity of charges in the charge spread blocking regions BA while the two-step erasing operation is repeated a predetermined number of times. A number of times that the two-step erasing operation is performed may be counted by the counter 160. The control circuit 170 may receive information regarding the number of times that the two-step erasing operation is performed from the counter 160, and perform the pre-programming operation based on the number of times that the two-step erasing operation has been performed. In an embodiment, the pre-programming operation may be performed before every three or four times two-step erasing operation is performed. Furthermore, the first erasing step S10 and the second erasing step S20 may be independently performed one or more times. However, embodiments are not limited thereto.

Figure 7A:
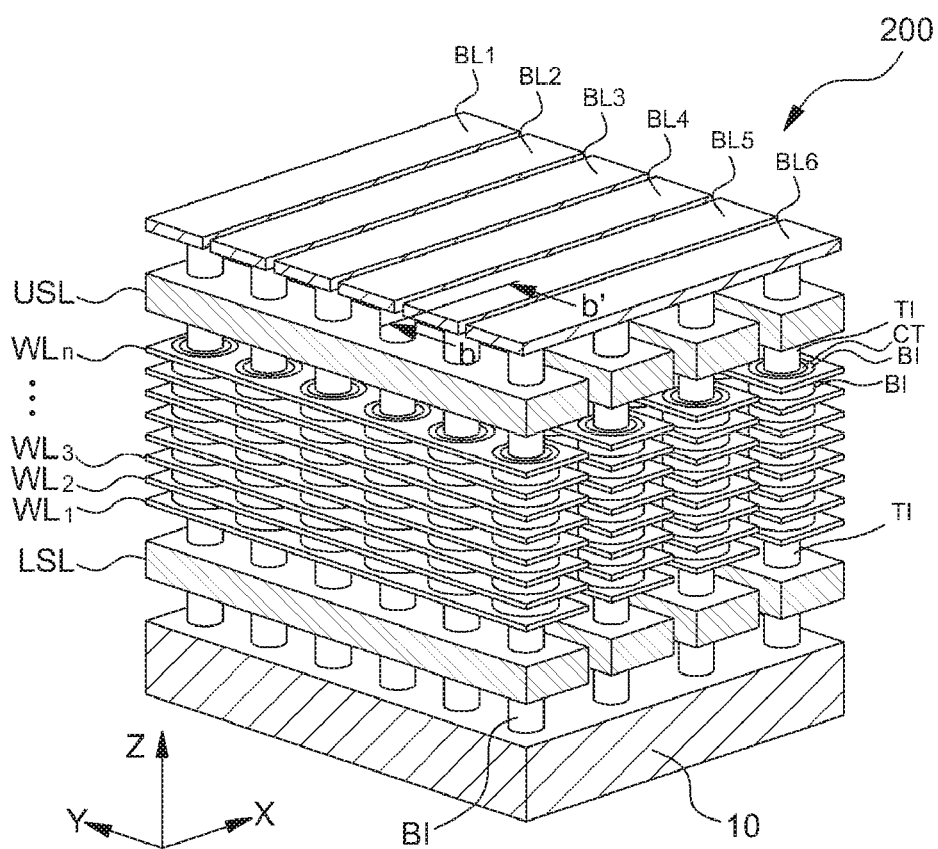
FIG. 7A is a perspective view of a 3-dimensional non-volatile memory device having a vertical-type channel according to an embodiment of the present disclosure.
Figure 7B:
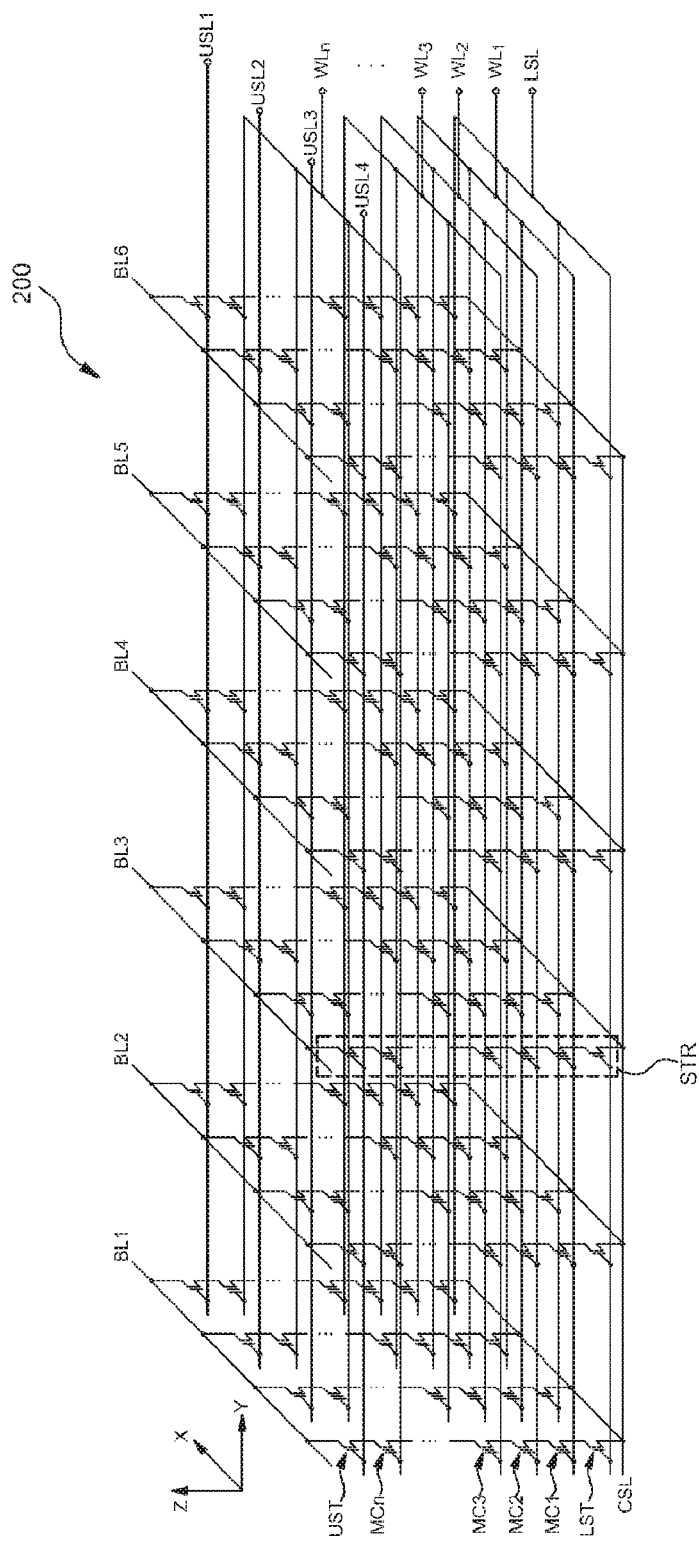
FIG. 7B is a circuit diagram of the 3-dimensional non-volatile memory device of FIG. 7A.
Figure 7C:
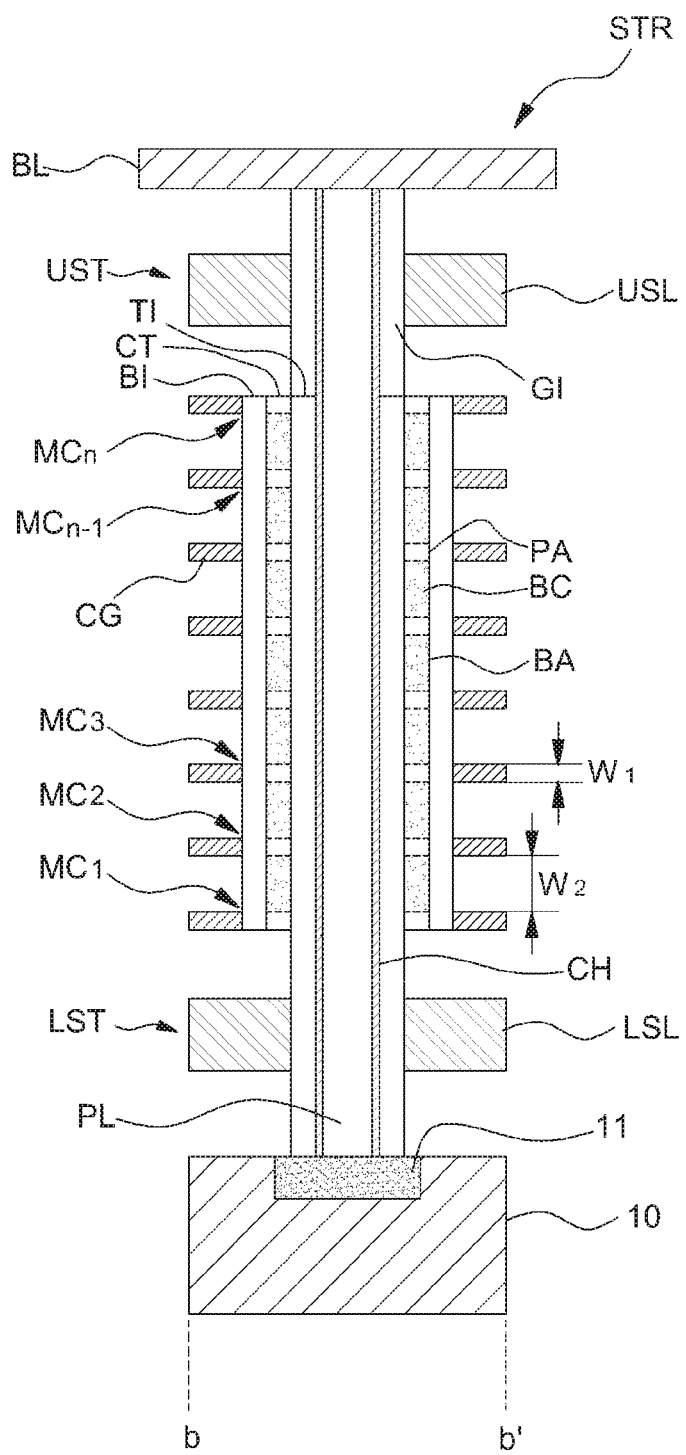
FIG. 7C is a cross-sectional view of a memory string of the 3-dimensional non-volatile memory device of FIG. 7A, taken along a line b-b' of FIG. 7A.

FIG. 7A is a perspective view of a 3-dimensional non-volatile memory device 200 having a vertical-type channel according to an embodiment of the present disclosure, FIG. 7B is a circuit diagram of the 3-dimensional non-volatile memory device 200 of FIG. 7A, and FIG. 7C is a cross-sectional view of a memory string of the 3-dimensional non-volatile memory device 200 of FIG. 7A, taken along a line b-b' of FIG. 7A.

Referring to FIGS. 7A and 7B, the 3-dimensional non-volatile memory device 200 may include a memory cell array consisting of a plurality of memory strings STR. The memory cell array may include a plurality of bit lines $BL_1$ to $BL_6$, a plurality of word lines $WL_1$ to $WL_n$, a plurality of upper select lines USL, a plurality of lower select lines LSL, and a common source line CSL. The plurality of memory strings STR may be coupled to and disposed between the bit lines $BL_1$ to $BL_6$ and the common source line CSL. Numbers of the bit lines, the word lines, and memory cells shown in FIGS. 7A and 7B are merely examples, and embodiments are not limited thereto.

Each of the strings STR may include upper and lower select transistors UST and LST and a plurality of memory cells MC connected in series between the upper select transistor UST and the lower select transistor LST. Drains of the upper select transistors UST of the strings STR may be connected to the bit lines $BL_1$ to $BL_6$, whereas sources of the lower select transistors LST of the strings STR may be connected to the common source line CSL. The common source line CSL is a wiring to which the sources of the lower select transistors LST are connected in common. Referring to FIG. 7C, the non-volatile memory device 200 may include an impurity region (or a well) 11 in a substrate 10 to provide the common source line CSL.

Furthermore, gates of the upper select transistors UST coupled to the strings STR may be connected to upper select lines USL1 to USL4, whereas gates of the lower select transistors LST coupled to the strings STR may be connected to lower select lines LSL. The memory cells MC are connected to the word lines $WL_1$ to $WL_n$.

FIGS. 7A to 7C show that, in the 3-dimensional non-volatile memory device 200, 24 memory cells are arranged at each x-y plane, and 8 x-y planes are stacked, but embodiments are not limited thereto. In FIGS. 7A and 7C, n is 8. In such a vertical-type memory cell array, memory cells MC are 3-dimensionally arranged in a z-axis direction perpendicular to an x-y plane that is parallel to a main surface of the substrate 10, and thus each of the strings STR has a structure in which a plurality of memory cells MC are connected to one another in series in the z-axis direction. To this end, the select transistors UST and LST and a channel of a memory cell transistor may be arranged in the z-axis direction perpendicular to the x-y plane.

Referring to FIGS. 7A and 7C, a plurality of semiconductor pillars PL combined with conductive layers LSL, WL, and USL may be arranged on the substrate 10. The semiconductor pillars PL do not necessarily penetrate through the conductive layers LSL, WL, and USL, and may be combined with the conductive layers LSL, WL, and USL by contacting portions of sidewalls of the conductive layers LSL, WL, and USL.

The semiconductor pillars PL may be electrically coupled to the impurity region 11 in the substrate 10. Each of the semiconductor pillar PL provides a channel layer CH, and may be a solid type semiconductor layer or may have a core-shell structure in which an insulation pillar constitutes a core and a semiconductor material layer for the channel layer CH surrounds the core. According to another embodiment, the semiconductor pillar PL may be a hollow pipe-type semiconductor pillar. The semiconductor pillar PL shown in FIG. 7C has a solid cylindrical structure.

Furthermore, the entire semiconductor pillar PL may exhibit a same conductive type, or at least surfaces of the semiconductor pillar PL may exhibit a conductive type. In an embodiment, the semiconductor pillar PL may exhibit an N+ conductive type and provide a junctionless NAND structure. According to another embodiment, the semiconductor pillar PL may exhibit a P+ conductive type and provide a NAND structure operating in an enhancement mode.

The semiconductor pillar PL may contain a monocrystalline or polycrystalline semiconductor material. The semiconductor material may include a Group III-V semiconductor material, such as silicon (Si), germanium (Ge), a Si—Ge compound, GaAs, InP, or the like. In an embodiment, the semiconductor pillar PL may provide the channel layer CH using a semiconductor material including carbon nanotubes, graphene, or metal oxides. In an embodiment, the channel layer CH may be doped with impurity ions to form an N+ or P+ conductive type semiconductor.

A first insulation layer TI, a charge trap layer CT, and a second insulation layer BI are sequentially formed on sidewalls of the semiconductor pillar PL on which a plurality of memory cells is defined. A stacked structure including the first insulation layer TI, the charge trap layer CT, and the second insulation layer BI is not individualized to each memory cell and expands to adjacent memory cells, and thus the charge trap layer CT may be shared by a plurality of memory cells constituting a single string. The first insulation layer TI may be disposed between the semiconductor pillar PL and a pattern for a select line, e.g., USL or LSL, extend in the z-axis direction, and function as a gate insulation layer GI.

The charge trap layer CT includes program regions PA and charge spread blocking regions BA. Each of the program regions PA is disposed below a corresponding one of control electrodes CG of the plurality of memory cells of the string. Each of the charge spread blocking regions BA is disposed between two adjacent program regions PA and thus disposed between two adjacent control electrodes CG. As described above in relation to the flat-panel type non-volatile memory device of FIG. 3A, a potential barrier is formed by space charges injected to the charge spread blocking regions BA of the 3-dimensional non-volatile memory device 200. As a result, program charges trapped in a corresponding program region PA do not spread to adjacent memory cells, and thus data retention characteristics of the 3-dimensional non-volatile memory device 200 may be improved.

According to an embodiment, to preserve space charges of the charge spread blocking regions BA, the 3-dimensional non-volatile memory device 200 may perform a two-step erasing operation including a first erasing step and a second erasing step that have been described above with reference to FIGS. 4A to 4C. For example, in the first erasing step, word lines of even-numbered turns are grounded, an inhibit voltage $V_{INHIBIT}$ is applied to word lines of odd-numbered turns or the word lines of the odd-numbered turns are electrically floated, and an erase voltage $V_{ERS}$ is applied to channel layers CH of semiconductor pillars. Therefore, program charges in program regions of memory cells combined with the word lines of the even-numbered turns are erased. In the second erasing step, the word lines of the odd-numbered turns are grounded, the inhibit voltage $V_{IN-HIBIT}$ is applied to the word lines of the even-numbered turns or the word lines of the even-numbered turns are electrically floated, and the erase voltage $V_{ERS}$ is applied to the channel layers CH of the semiconductor pillars. Therefore, program charges in program regions of memory cells combined with the word lines of the odd-numbered turns may be erased. Since the two-step erasing operation reduces the strength of a fringing electric field generated during an erasing operation, charges BC trapped in the charge spread blocking regions BA may be stably preserved.

According to an embodiment, in the 3-dimensional non-volatile memory device 200, the two-step erasing operation described above with reference to FIGS. 5A and 5B may be applied to intentionally inject charges to the charge spread blocking regions BA. The control circuit 170 performs the pre-programming operation on all of a plurality of memory cells $MC_1$ to $MC_n$ simultaneously. The pre-programming operation may be performed by a string, page, or block unit. Preferably, the pre-programming operation may be performed by a block unit. A program voltage $V_{PGM}$ may be applied to word lines $WL_1$ to $WL_n$ combined with control electrodes CG of the plurality of memory cells $MC_1$ to $MC_n$, and gate electrodes of the select transistors UST and LST and corresponding bit lines BL may be grounded according to a unit by which the pre-programming operation is performed.

According to an embodiment, after the pre-programming operation is completed, the two-step erasing operation including the first erasing step and the second erasing step may be performed as described above. The two-step erasing operation is suitable for preserving the charges BC in the charge spread blocking regions BA. After the two-step erasing operation is performed, the verification operation may be performed. The verification operation is an operation for determining whether all of the memory cells $MC_1$ to $MC_n$ are in a erase state, where ON/OFF states of the memory cells $MC_1$ to $MC_n$ are checked by applying a verify voltage $V_{VFY}$ to the word lines $WL_1$ to $WL_n$ coupled to the memory cells $MC_1$ to $MC_n$. If an operation for erasing data of the memory cells is determined to be failed, the two-step erasing operation may be repeated. On the other hand, if the operation for erasing the data of the memory cells is determined to be succeeded or passed, the two-step erasing operation is terminated without being repeated. In the above-stated embodiments, each of the first erasing step and the second erasing step may be independently performed one or more times. However, embodiments are not limited thereto.

However, the vertical channel-type 3-dimensional non-volatile memory device shown 200 in FIGS. 7A to 7C is merely an example, and embodiments are not limited thereto. Various modifications may be applied to the vertical channel-type 3-dimensional non-volatile memory device 200 to have a SMArT (Stacked Memory Array Transistor) structure, a bit cost scalable technology (BiCS) structure, such as, pipe-shaped-BiCS, a vertical-recess-array-transistor (VRAT) structure, or a terabit cell array transistor (TCAT) structure, which are well-known in the art.

Figure 8:
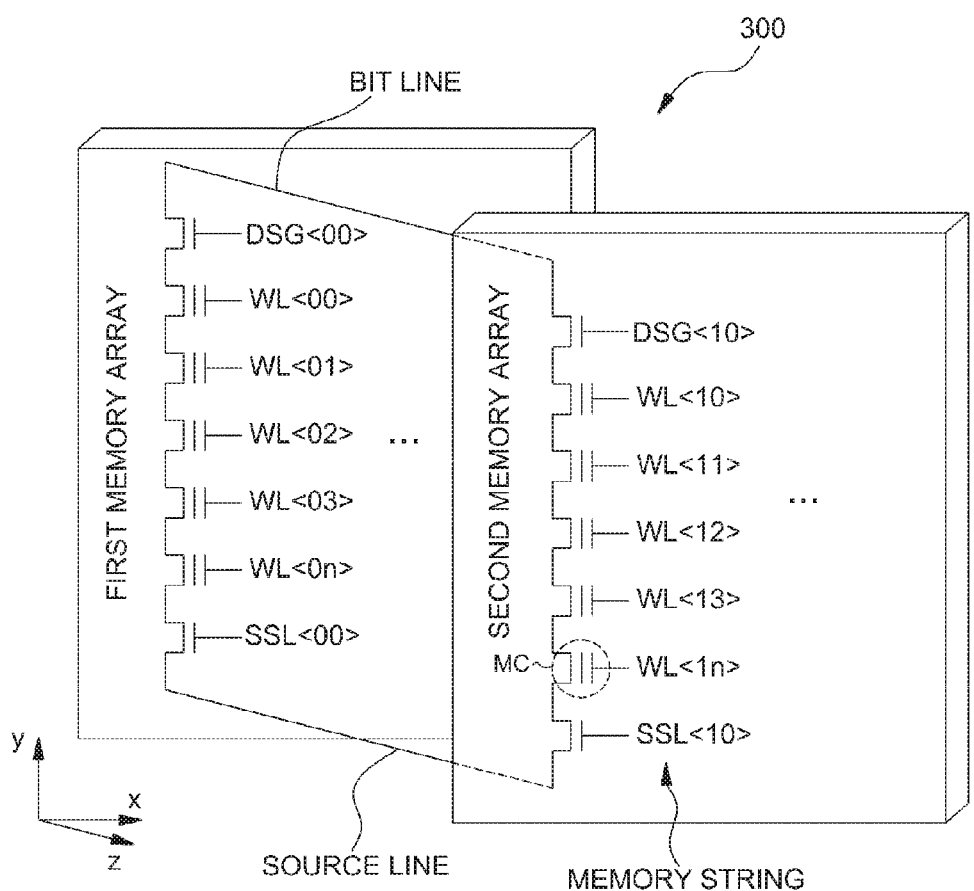
FIG. 8 is a circuit diagram of a vertically-stacked 3-dimensional non-volatile memory device according to an embodiment of the present disclosure.

FIG. 8 is a circuit diagram of a vertically-stacked 3-dimensional data storage device 300 according to an embodiment of the present disclosure.

Referring to FIG. 8, the vertically-stacked 3-dimensional data storage device 300 has a structure in which NAND strings are arranged on an x-y plane and the NAND strings on the x-y plane are vertically stacked more than two times in a z-axis direction perpendicular to the x-y plane. The vertically-stacked 3-dimensional data storage device 300 may be provided by stacking two or more flat-panel type memory cell arrays shown in FIG. 2 on a substrate. In the vertically-stacked 3-dimensional data storage device 300, a plurality of layers of memory cell arrays may be formed on a single substrate, or the plurality of layers of memory cell arrays may be respectively formed on different substrates. When the plurality of memory cell arrays are respectively formed on different substrates, the plurality of memory cell arrays respectively formed on the different substrates may be stacked together.

In the vertically-stacked 3-dimensional data storage device 300, a charge trap layer is shared by a plurality of memory cells MC belonging to each NAND string. The charge trap layer may include program regions, which are respectively arranged below control electrodes of the plurality of memory cells, and charge spread blocking regions, each of which is disposed between two adjacent program regions. In this case, a potential barrier may be formed in the charge spread blocking region by charging the charge spread blocking region with charges having the same polarity as program charges stored in the program region, thereby improving data retention characteristics. Furthermore, as described above, the pre-programming operation and the two-step erasing operation may be performed to form and preserve the potential barrier in the charge spread blocking region.

Figure 9:
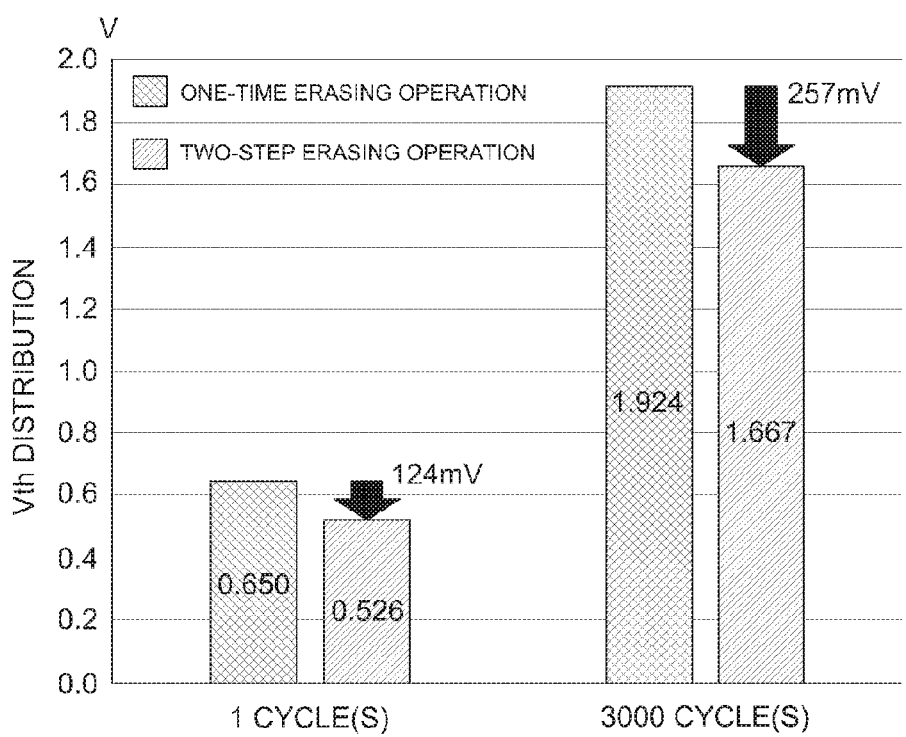
FIG. 9 is a graph showing evaluation results of data retention characteristics of a data storage device including a non-volatile memory device according to an embodiment of the present disclosure.

FIG. 9 is a graph showing an evaluation result of data retention characteristics of a data storage device including a non-volatile memory device according to an embodiment of the present disclosure. A y-axis of the graph indicates distribution of threshold voltages of memory cells.

Referring to FIG. 9, if a programming operation is performed once, a first scheme using a two-step erasing operation shows distribution of threshold voltages $V_{th}$ of programmed memory cells that is reduced by about 124 mV as compared to a second scheme using a one-time erasing operation that simultaneously erases data of all memory cells.

Furthermore, if the programming operation is performed 3,000 times by using a program after erase scheme, the first scheme shows distribution of threshold voltages $V_{th}$ of programmed memory cells that is reduced by about 257 mV as compared to the second scheme. Therefore, according to the embodiments of the present disclosure, spreading of program charges that widens threshold voltage distribution may be suppressed, and thus data retention characteristics may be improved.

Figure 10:
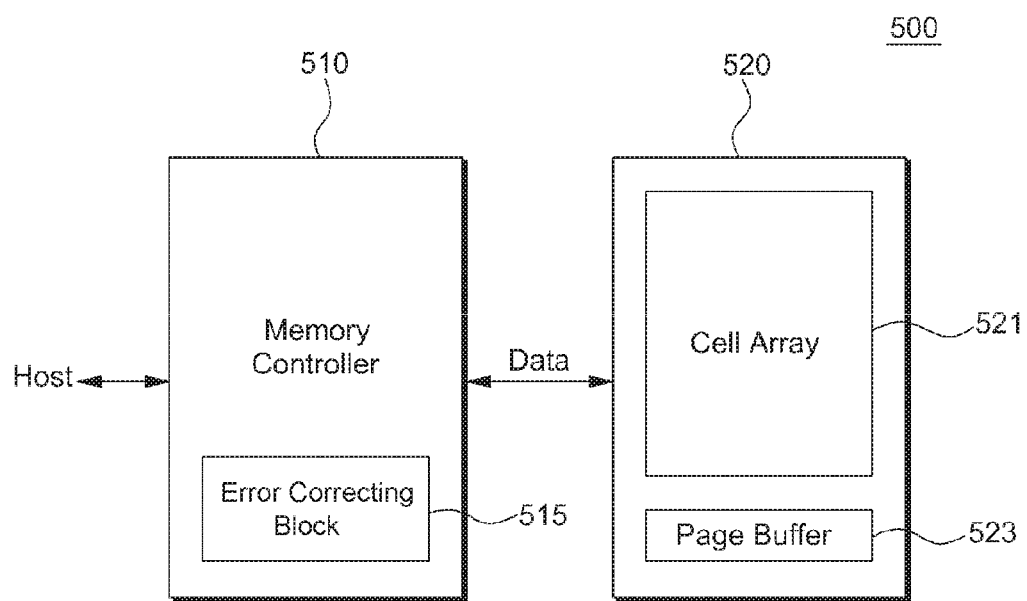
FIG. 10 is a block diagram showing a memory system according to an embodiment.

FIG. 10 is a block diagram showing a memory system 500 according to an embodiment.

Referring to FIG. 10, the memory system 500 includes a memory controller 510 and a non-volatile memory device 520. The memory controller 510 may perform an error correcting code with respect to the non-volatile memory device 520. The memory controller 510 may control the non-volatile memory device 520 based on commands and addresses from the outside.

When a program request is received from a host, the memory controller 510 may perform an error correcting encoding for data to be programmed. Furthermore, the memory controller 510 may control the non-volatile memory device 520 to program the encoded data at a memory region corresponding to a provided address. During a read operation, the memory controller 510 may perform an error correcting decoding for data output from the non-volatile memory device 520. Errors included in the output data may be corrected by the error correcting decoding. To detect and correct errors, the memory controller 510 may include an error correcting block 515.

The non-volatile memory device 520 may include a cell array 521 and a page buffer 523. The cell array 521 may include an array of single level memory cells or multi-level memory cells each storing 2 or more bits. The memory controller 510 may include a control circuit for generating a potential barrier at a charge spread blocking region in the cell array 521. According to an embodiment, the memory controller 510 may further include a counter for counting a number of times that an erasing operation is performed with respect to memory cells of the cell array 521. According to another embodiment, the memory controller 510 may further include a pass/fail verification circuit. The counter and/or the pass/fail verification circuit are not limited to hardware components, and may be embodied as software components or combinations of software and hardware.

Figure 11:
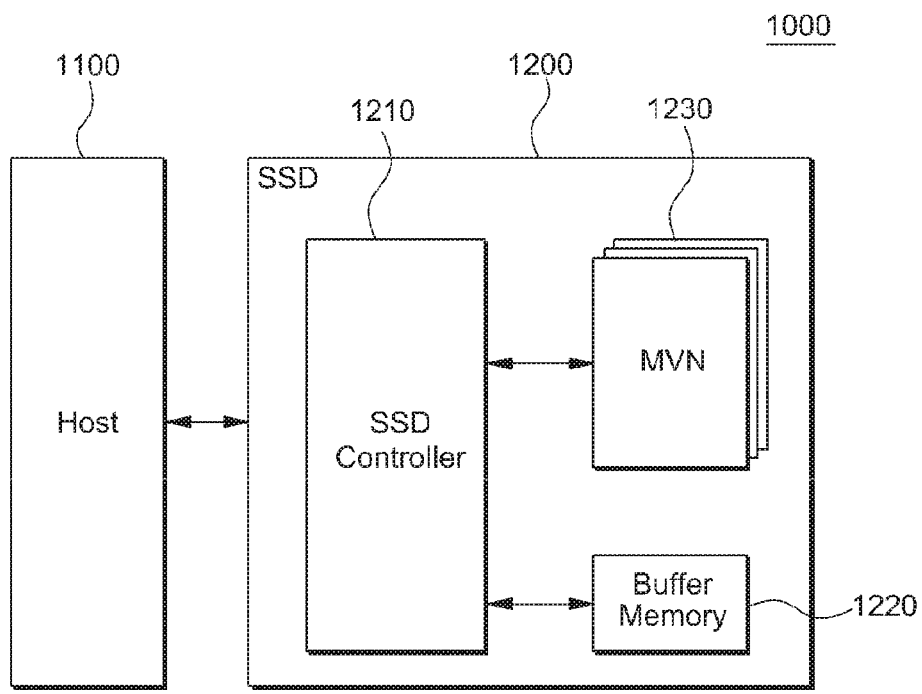
FIG. 11 is a block diagram showing a storage device including a SSD according to an embodiment.

FIG. 11 is a block diagram showing a storage device 1000 including an SSD according to an embodiment.

Referring to FIG. 11, the storage device 1000 includes a host 1100 and an SSD 1200. The SSD 1200 may include an SSD controller 1210, a buffer memory 1220, and a data storage device 1230 that may include a non-volatile memory device. The SSD controller 1210 provides electrical and physical connections between the host 1100 and the SSD 1200. According to an embodiment, the SSD controller 1210 provides an interface between the host 1100 and the SSD 1200 in correspondence to a bus format of the host 1100. Furthermore, the SSD controller 1210 may decode commands provided by the host 1100 and access the non-volatile memory device 1230 based on a result of the decoding. The bus format of the host 1100 may include any of a USB (Universal Serial Bus), a SCSI (Small Computer System Interface), a PCI express, an ATA (Advanced Technology Attachment), a PATA (Parallel ATA), a SATA (Serial ATA), and a SAS (Serial Attached SCSI).

Data to be programmed provided by the host 1100 or data read out from the non-volatile memory device 1230 may be temporarily stored in the buffer memory 1220. When the host 1100 sends a read request and data existing in the non-volatile memory device 1230 is cached, the buffer memory 1220 may provide a cache function to provide cached data directly to the host 1100. Generally, a data transmission rate based on a bus format (e.g., SATA or SAS) of the host 1100 may be faster than a data transmission rate of memory channels of the SSD 1200. In this case, the large-capacity buffer memory 1220 may be provided to minimize performance deterioration due to the speed difference between the host 1100 and the SSD 1200. The buffer memory 1220 may be a synchronous DRAM for providing sufficient buffering. However, embodiments are not limited thereto.

The non-volatile memory device 1230 may be provided as a storage medium of the SSD 1200. In an embodiment, the non-volatile memory device 1230 may be a NAND-type or NOR-type flash memory having large storage capacity. For another embodiment, a phase-change memory, a magnetic memory, a resistive memory, a ferrodielectric memory, or a memory system including a combination thereof may be applied as the non-volatile memory device 1230.

Figure 12:
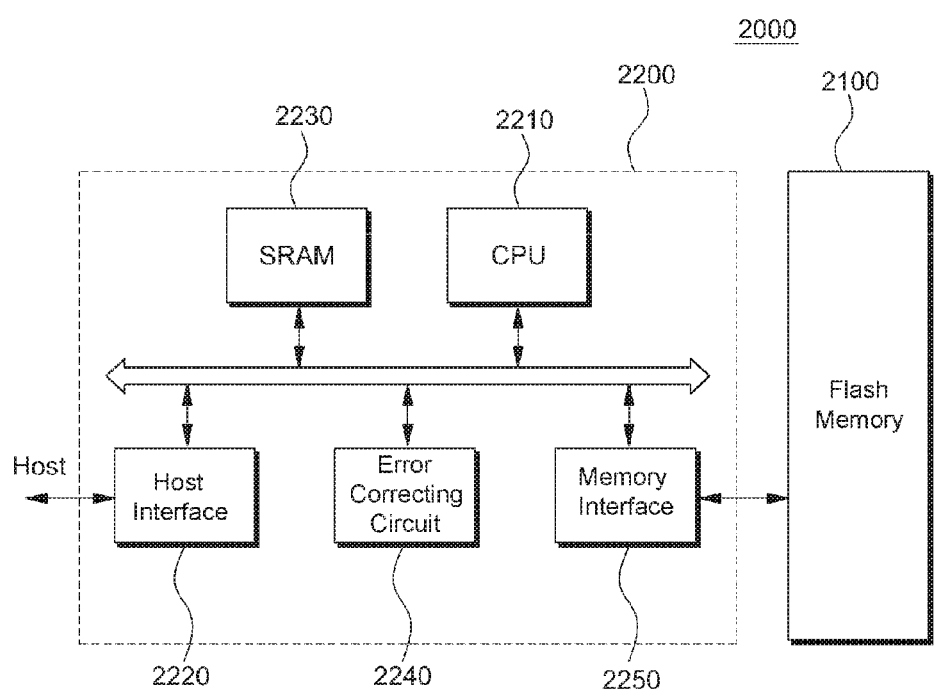
FIG. 12 is a block diagram showing a memory system according to another embodiment.

FIG. 12 is a block diagram showing a memory system 2000 according to another embodiment.

Referring to FIG. 12, the memory system 2000 may include a memory controller 2200 and a flash memory 2100. In an embodiment, the flash memory 2100 may be the non-volatile memory device 100 described above with reference to FIGS. 1 through 8, and the memory controller 2200 may be the control circuit 170 of FIG. 1. In the flash memory 2100, a potential barrier may be generated at a charge spread blocking region of a charge trap layer by charging the charge spread blocking region with charges having the same polarity as that of program charges stored in a program region, thereby improving data retention characteristics of the flash memory 2100. As a result, the flash memory 2100 may exhibit reliable program performance.

The memory controller 2200 is configured to control the flash memory 2100. An SRAM 2230 may be used as a memory for an operation of a CPU 2210. A host interface 2220 may embody a data exchange protocol to connect the memory system 2000 to a host. An error correcting circuit 2240 included in the memory controller 2200 may detect and correct errors included in data read out from the flash memory 2100. A memory interface 2250 may interface with the flash memory 2100. The CPU 2210 may perform overall control operations for data exchange of the memory controller 2200. The memory system 2000 may further include a ROM (not shown) that stores code data for interfacing with the host.

The flash memory 2100 may communicate with an external device (e.g., a host) using one of various interface protocols, such as USB, MMC, PCI-E, SAS, SATA, PATA, SCSI, ESDI, or IDE. The memory system 2000 may be applied to various user devices, such as a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving data wirelessly, a home network, and the like.

Figure 13:
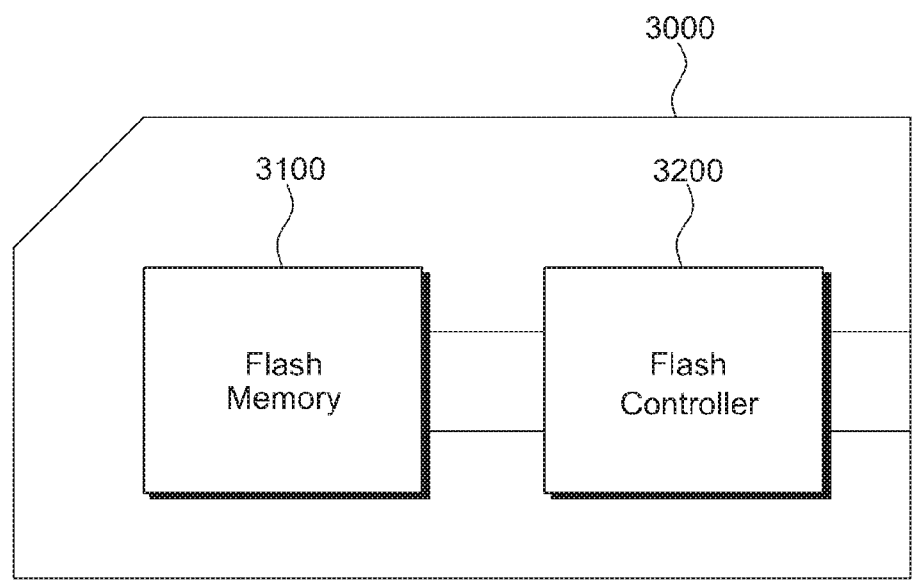
FIG. 13 is a block diagram showing a data storage device according to another embodiment.

FIG. 13 is a block diagram showing a data storage device 3000 according to another embodiment.

Referring to FIG. 13, the data storage device 3000 may include a flash memory 3100 and a flash controller 3200. The flash controller 3200 may control the flash memory 3100 based on control signals received from an external device connected to the data storage device 3000. The flash memory 3100 may have any of various structures, such as a stack flash structure in which a plurality of layers of arrays are stacked, a flash structure without a source and a drain, a pin-type flash structure, a 3-dimensional flash structure, or a combination thereof.

The flash memory 3100 may perform an erasing operation, which is a two-step erasing operation or a combination of the two-step erasing operation and a pre-programming operation, thereby generating and maintaining space charges in a charge spread blocking region of a charge trap layer during the erasing operation. Therefore, it is possible to improve data retention characteristics after a programming operation is performed. The data storage device 3000 may constitute a memory card device, an SSD device, a multi-media card device, an SD card, a memory stick device, a hard disk drive device, a hybrid drive device, or a USB flash device. In an embodiment, the data storage device 3000 may be a memory card that satisfies a standard or a specification to be used by an electronic device, such as a digital camera or a personal computer.

Figure 14:
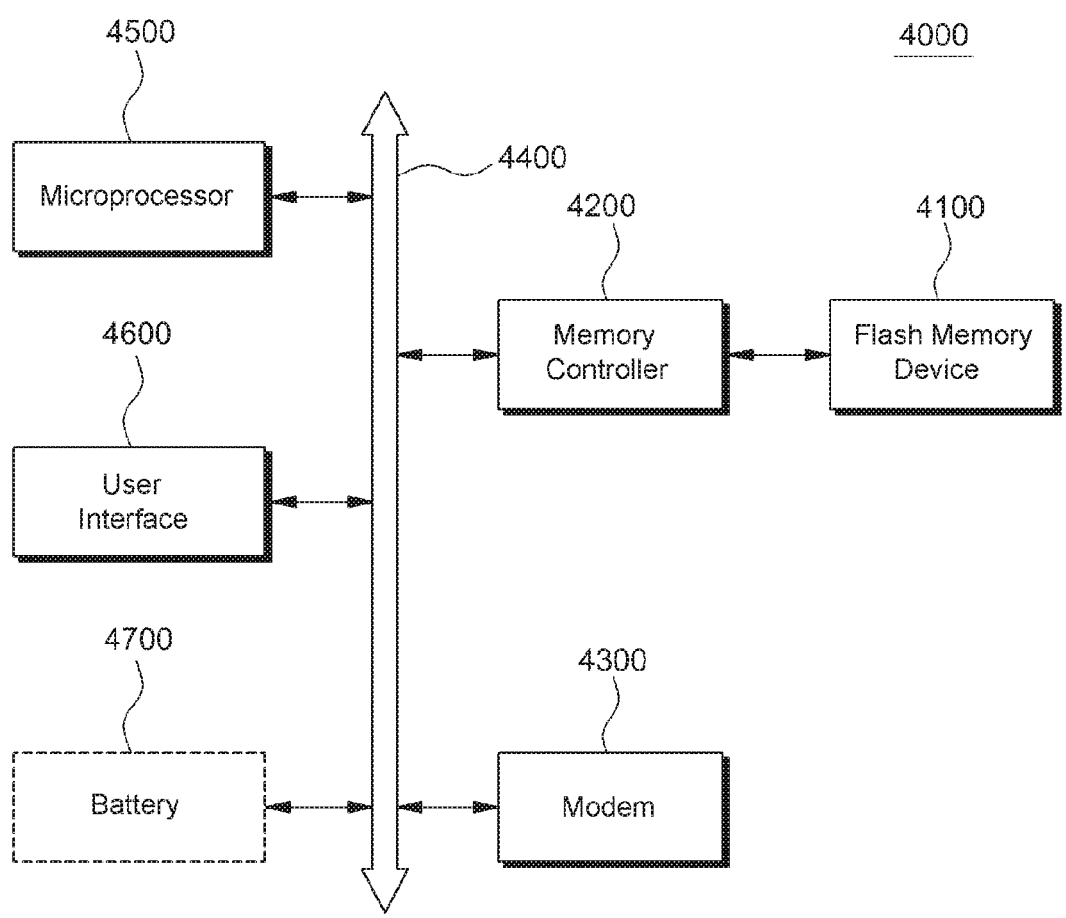
FIG. 14 is a block diagram showing a computing system according to an embodiment.

FIG. 14 is a block diagram showing a computing system 4000 according to an embodiment.

Referring to FIG. 14, the computing system 4000 may include a flash memory device 4100, a memory controller 4200, a modem 4300, such as a baseband chipset, a microprocessor 4500, and a user interface 4600 that are electrically connected to each other through a bus 4400. The flash memory device 4100 may be a non-volatile memory device with improved data retention characteristics by employing a charge spread blocking region in a charge trap storage layer described above.

The computing system 4000 may be a mobile device. In this case, the computing system 4000 may further include a battery 4700 for supplying a voltage for operating the computing system 4000. Although not shown, the computing system 4000 may further include an application chipset, a camera image processor (CIS), or a mobile DRAM. The memory controller 4200 and the flash memory device 4100 may constitute an SSD using a non-volatile memory device for storing data.

A non-volatile memory device and/or a memory controller according to an embodiment may be mounted using various types of packages. The various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi-Chip Package (MCP), Wafer-level Fabricated Package (WFP), Wafer-Level Processed Stack Package (WSP), and so on.

Furthermore, the non-volatile memory device described above may operate at various temperatures. For example, if the non-volatile memory device is applied to a power device, a plurality of memory cells may operate under an environment with a temperature higher than the room temperature, where a pre-programming operation and a two-step erasing operation may be performed under such a high-temperature environment. On the contrary, a plurality of memory cells may operate under an environment with a temperature lower than the room temperature. According to another embodiment, a pre-programming operation and a two-step erasing operation may be performed at different temperature ranges.

According to embodiments of the present disclosure, by charging charge spread blocking regions adjacent to program regions of a charge trap layer with charges having the same polarity as that of program charges stored in the program regions, a potential barrier is generated in the charge spread blocking regions, and thus spreading of the program charges may be prevented or reduced. As a result, a non-volatile memory device having excellent data retention characteristics and improved reliability may be provided to handle continuously increasing integration, capacity, and, selectively, multi-level programming.

Furthermore, according to an embodiment of the present disclosure, a method of driving a non-volatile memory device to generate and maintain a potential barrier by injecting charges at charge spread blocking regions includes performing a pre-programming operation and/or a two-step erasing operation, thereby securing excellent data retention characteristics.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A non-volatile memory device comprising:
   a memory cell array including a plurality of memory cells;
   a control circuit; and
   a counter,
   wherein each of the plurality of memory cells comprises a channel layer, a charge trap layer disposed over the channel layer, and a control electrode disposed over the charge trap layer, the charge trap layer being shared by the plurality of memory cells in the memory cell array,
   wherein the charge trap layer comprises:
      program regions respectively disposed below the control electrodes of the plurality of memory cells; and
      charge spread blocking regions, each of which is disposed between two adjacent ones of the program regions and between two adjacent ones of the control electrodes,
   wherein the control circuit is configured to control the memory cell array so that a potential barrier is generated in the charge spread blocking regions by charging the charge spread blocking regions with charges having the same polarity as that of program charges stored in the program regions,
   wherein the control circuit performs a two-step erasing operation comprising:
      a first erasing step for erasing data of even-numbered memory cells from among the plurality of memory cells; and
      a second erasing step for erasing data of odd-numbered memory cells from among the plurality of memory cells, the second erasing step being performed separately in time from the first erasing step,
   wherein, before the two-step erasing operation is performed, the control circuit performs a pre-programming operation for charging the program regions and the charge spread blocking regions of the charge trap layer with charges having a same polarity by applying a program voltage to the control electrodes of the plurality of memory cells simultaneously, and
   wherein the counter counts a number of times that the two-step erasing operation is performed, and the control circuit receives information regarding the number of times that the two-step erasing operation is performed from the counter and, when the two-step erasing operation is repeated a specific number of times, performs the pre-programming operation before the specific number of times the two-step erasing operation is performed.

2. The non-volatile memory device of claim 1, wherein the memory cell array comprises a plurality of memory strings, each memory string including the plurality of memory cells that are connected to one another in series.

3. The non-volatile memory device of claim 1, wherein the channel layer is provided by a semiconductor pillar extending in a direction perpendicular to a main surface of a substrate,
   a first insulation layer, the charge trap layer, and a second insulation layer are sequentially disposed on sidewalls of the semiconductor pillar, and
   the memory cell array is a 3-dimensional memory cell array.

4. The non-volatile memory device of claim 3, wherein the first insulation layer is a tunneling insulation layer, and the second insulation layer is a blocking insulation layer.

5. The non-volatile memory device of claim 1, wherein the pre-programming operation is performed by charging the charge spread blocking regions of the charge trap layer using a fringing electric field.

6. The non-volatile memory device of claim 1, wherein the pre-programming operation is performed for two or more pages, one or more strings, or one or more blocks in the memory cell array, or for the entire memory cell array.

7. The non-volatile memory device of claim 1, wherein the charge spread blocking regions are charged by the injection of electric charge carriers from the channel layer, Fowler-Nordheim tunneling of electric charge carriers from a source or a drain of the channel layer, or Fowler-Nordheim tunneling of electric charge carriers from the channel layer.

8. The non-volatile memory device of claim 1, wherein the control circuit performs an erasing operation on the plurality of memory cells to preserve the potential barrier.

9. The non-volatile memory device of claim 8, wherein a width of the charge spread blocking region is greater than a width of the program region.

10. The non-volatile memory device of claim 1, wherein, if the two-step erasing operation is performed a number of times, an order of performing the first erasing step and the second erasing step is changed each time the two-step erasing operation is performed.

11. The non-volatile memory device of claim 1, wherein, when the two-step erasing operation is performed a number of times, the pre-programming operation is performed before each two-step erasing operation is performed.

12. The non-volatile memory device of claim 1, wherein, in case of programming one or more selected memory cells according to a program after erase (PAE) scheme, the pre-programming operation and the two-step erasing operation following the pre-programming operation are performed before a program operation is performed on the selected memory cells, and
wherein if data is erased from a predetermined area comprising some of the plurality of memory cells, one or more strings, one or more pages, or one or more blocks, the pre-programming operation and the two-step erasing operation are performed with respect to the predetermined area.

13. The non-volatile memory device of claim 1, wherein the pre-programming operation and the two-step erasing operation are performed to initialize the plurality of memory cells.

14. A method of driving a non-volatile memory device, the method comprising:
a first erasing step for erasing data of even-numbered memory cells among a plurality of memory cells; and
a second erasing step for erasing data of odd-numbered memory cells from among the plurality of memory cells, the second erasing step being performed separately in time from the first erasing step,
wherein the plurality of memory cells shares a charge trap layer,
wherein the charge trap layer comprises program regions respectively allocated to the plurality of memory cells and charge spread blocking regions, each of the charge spread blocking regions being disposed between two adjacent ones of the program regions, and
wherein charges of the charge spread blocking regions have the same polarity as that of program charges stored in the program regions.

15. The method of claim 14, wherein the plurality of memory cells is included in a memory string.

16. The method of claim 14, wherein, if the two-step erasing operation is performed a number of times, a sequence for performing the first erasing step and the second erasing step is changed each time the two-step erasing operation is performed.

17. The method of claim 14, further comprising performing a pre-programming operation on the plurality of memory cells before the two-step erasing operation,
wherein the pre-programming operation is performed to charge the charge spread blocking regions with charges having the same polarity as that of the program charges stored in the program regions.

18. The method of claim 17, wherein, in the pre-programming operation, the program regions and the charge spread blocking regions of the charge trap layer are simultaneously charged with charges having a same polarity by applying a program voltage to control electrodes of the plurality of memory cells simultaneously.

19. The method of claim 17, wherein the pre-programming operation is performed for at least two pages, one or more strings, or one or more blocks of a memory cell array including the plurality of memory cells, or for the entire memory cell array.

20. The method of claim 17, wherein, when the two-step erasing operation is performed a number of times, the pre-programming operation is performed prior to each time the two-step erasing operation is performed.

21. The method of claim 17, wherein the pre-programming operation is performed one time whenever the two-step erasing operation is repeated a specific number of times.

22. A method of driving a non-volatile memory device, the method comprising performing a pre-programming operation on a plurality of memory cells to charge spread blocking regions with charges having the same polarity as that of program charges stored in program regions,
wherein the plurality of memory cells shares a charge trap layer,
wherein the charge trap layer comprises the program regions respectively allocated to the plurality of memory cells and the charge spread blocking regions, each of the charge spread blocking regions being disposed between two adjacent ones of the program regions,
wherein the method further comprises performing a two-step erasing operation after the pre-programming operation is performed,
wherein the two-step erasing operation comprises:
a first erasing step for erasing data of even-numbered memory cells from among the plurality of memory cells; and
a second erasing step for erasing data of odd-numbered memory cells from among the plurality of memory cells, the second erasing step being performed separately in time from the first erasing step,
wherein, in case of programming one or more memory cells selected by using a program after erase (PAE) scheme, the pre-programming operation and the two-step erasing operation are performed before a program operation is performed on the selected memory cells, and
wherein if data is erased from a predetermined area comprising some of the plurality of memory cells, one or more strings, one or more pages, or one or more blocks, the pre-programming operation and the two-step erasing operation are performed with respect to the predetermined area.

23. A method of driving a non-volatile memory device, the method comprising performing a pre-programming operation on a plurality of memory cells to charge spread blocking regions with charges having the same polarity as that of program charges stored in program regions,
wherein the plurality of memory cells shares a charge trap layer,
wherein the charge trap layer comprises the program regions respectively allocated to the plurality of memory cells and the charge spread blocking regions, each of the charge spread blocking regions being disposed between two adjacent ones of the program regions,
wherein the method further comprises performing a two-step erasing operation after the pre-programming operation is performed,
wherein the two-step erasing operation comprises:
a first erasing step for erasing data of even-numbered memory cells from among the plurality of memory cells; and
a second erasing step for erasing data of odd-numbered memory cells from among the plurality of memory cells, the second erasing step being performed separately in time from the first erasing step, and
wherein the pre-programming operation and the two-step erasing operation are performed to initialize the plurality of memory cells.

* * * * *